US008911577B2

(12) United States Patent

Holt et al.

(10) Patent No.: US 8,911,577 B2
(45) Date of Patent: Dec. 16, 2014

(54) CONTOURED FLUID-FILLED CHAMBER

(75) Inventors: Scott C. Holt, Portland, OR (US); Troy C. Lindner, Portland, OR (US); Christopher W. L. Brandt, Portland, OR (US)

(73) Assignee: NIKE, Inc., Beaverton, OR (US)

( * ) Notice: Subject to any disclaimer, the term of this patent is extended or adjusted under 35 U.S.C. 154(b) by 517 days.

(21) Appl. No.: 13/029,960

(22) Filed: Feb. 17, 2011

(65) Prior Publication Data

US 2011/0131739 A1 Jun. 9, 2011

Related U.S. Application Data

(62) Division of application No. 11/746,772, filed on May 10, 2007, now Pat. No. 7,950,169.

(51) Int. Cl.

| | |
|---|---|
| ***B29C 65/70*** | (2006.01) |
| ***A43B 13/22*** | (2006.01) |
| ***A43B 21/28*** | (2006.01) |
| ***A43B 17/03*** | (2006.01) |
| ***B29D 35/12*** | (2010.01) |
| ***B29C 65/00*** | (2006.01) |
| ***A43B 13/20*** | (2006.01) |

(52) U.S. Cl.

CPC ................. *A43B 13/20* (2013.01); *A43B 21/28* (2013.01); *A43B 17/03* (2013.01); *B29D 35/124* (2013.01); *B29D 35/122* (2013.01); *B29C 66/433* (2013.01); *B29C 66/438* (2013.01)

USPC ............. 156/145; 156/308.4; 36/29; 36/35 B; 36/153

(58) Field of Classification Search

CPC ..... B29C 66/433; B29C 66/438; A43B 13/20

USPC ........ 156/145–147, 156, 275.1, 308.2, 308.4, 156/309.6; 36/28, 29, 35 B, 153; 12/16.2–16.4, 42 R, 147 R–147 B

See application file for complete search history.

(56) References Cited

U.S. PATENT DOCUMENTS 900,867 A 10/1908 Miller
1,069,001 A 7/1913 Guy (Continued)

FOREIGN PATENT DOCUMENTS

AT 181938 5/1955
AT 200963 12/1958

(Continued)

OTHER PUBLICATIONS

Sports Research Review, NIKE, Inc., Jan./Feb. 1990.

(Continued)

*Primary Examiner* — John Goff
*Assistant Examiner* — Scott W Dodds
(74) *Attorney, Agent, or Firm* — Plumsea Law Group, LLC

(57) ABSTRACT

A fluid-filled chamber may be incorporated into footwear and other products. The chamber is formed from a polymer material that defines a first surface, a second surface located opposite the first surface, and a sidewall surface extending around a periphery of the chamber and between the first surface and the second surface. A plurality of bonds are spaced inward from the sidewall surface and join the first surface and the second surface, and the bonds are distributed to form a regularly-spaced array, such as a hexagonal array. In some configurations, the first surface and the second surface may define elliptically-shaped structures between the bonds. In addition, the bonds may be formed to have a slope that is an average of slopes of the first surface and the second surface in areas proximal the bonds.

18 Claims, 19 Drawing Sheets

(56) References Cited

U.S. PATENT DOCUMENTS 1,181,441 A 5/1916 Franklin
1,240,153 A 9/1917 Olsen
1,304,915 A 5/1919 Spinney
1,323,610 A 12/1919 Price
1,514,468 A 11/1924 Schopf
1,584,034 A 5/1926 Klotz
1,625,582 A 4/1927 Anderson
1,625,810 A 4/1927 Krichbaum
1,869,257 A 7/1932 Hitzler
1,916,483 A 7/1933 Krichbaum
1,970,803 A 8/1934 Johnson
2,004,906 A 6/1935 Simister
2,080,469 A 5/1937 Gilbert
2,086,389 A 7/1937 Pearson
2,269,342 A 1/1942 Johnson
2,365,807 A 12/1944 Dialynas
2,488,382 A 11/1949 Davis
2,546,827 A 3/1951 Lavinthal
2,600,239 A 6/1952 Gilbert
2,645,865 A 7/1953 Town
2,677,906 A 5/1954 Reed
2,703,770 A 3/1955 Melzer
2,748,401 A 6/1956 Winstead
2,762,134 A 9/1956 Town
2,978,006 A 4/1961 Clements
3,030,640 A 4/1962 Gosman
3,048,514 A 8/1962 Bentele et al.
3,120,712 A 2/1964 Menken
3,121,430 A 2/1964 O'Reilly
3,204,678 A 9/1965 Worcester
3,251,076 A 5/1966 Burke
3,284,264 A 11/1966 O'Rourke
3,335,045 A 8/1967 Post
3,366,525 A 1/1968 Jackson
3,469,576 A 9/1969 Smith et al.
3,568,227 A 3/1971 Dunham
3,589,037 A 6/1971 Gallagher
3,608,215 A 9/1971 Fukuoka
3,685,176 A 8/1972 Rudy
3,758,964 A 9/1973 Nishimura
3,765,422 A 10/1973 Smith
4,017,931 A 4/1977 Golden
4,054,960 A 10/1977 Pettit et al.
4,115,934 A 9/1978 Hall
4,123,855 A 11/1978 Thedford
4,129,951 A 12/1978 Petrosky
4,167,795 A 9/1979 Lambert, Jr.
4,183,156 A 1/1980 Rudy
4,187,620 A 2/1980 Selner
4,217,705 A 8/1980 Donzis
4,219,945 A 9/1980 Rudy
4,271,606 A 6/1981 Rudy
4,287,250 A 9/1981 Rudy
4,292,702 A 10/1981 Phillips
4,297,797 A 11/1981 Meyers
4,305,212 A 12/1981 Coomer
4,328,599 A 5/1982 Mollura
4,358,902 A 11/1982 Cole et al.
4,431,003 A 2/1984 Sztancsik
4,446,634 A 5/1984 Johnson et al.
4,458,430 A 7/1984 Peterson
4,483,030 A 11/1984 Plick et al.
4,486,964 A 12/1984 Rudy
4,506,460 A 3/1985 Rudy
4,547,919 A 10/1985 Wang
4,662,087 A 5/1987 Beuch
4,670,995 A 6/1987 Huang
4,686,130 A 8/1987 Kon
4,698,864 A 10/1987 Graebe
4,722,131 A 2/1988 Huang
4,744,157 A 5/1988 Dubner
4,779,359 A 10/1988 Famolare, Jr.
4,782,602 A 11/1988 Lakic
4,803,029 A 2/1989 Iversen et al.
4,817,304 A 4/1989 Parker et al.
4,823,482 A 4/1989 Lakic
4,845,338 A 7/1989 Lakic
4,845,861 A 7/1989 Moumdjian
4,874,640 A 10/1989 Donzis
4,891,855 A 1/1990 Cheng-Chung
4,906,502 A 3/1990 Rudy
4,912,861 A 4/1990 Huang
4,936,029 A 6/1990 Rudy
4,965,899 A 10/1990 Sekido et al.
4,972,611 A 11/1990 Swartz et al.
4,991,317 A 2/1991 Lakic
4,999,931 A 3/1991 Vermeulen
4,999,932 A 3/1991 Grim
5,014,449 A 5/1991 Richard et al.
5,022,109 A 6/1991 Pekar
5,025,575 A 6/1991 Lakic
5,042,176 A 8/1991 Rudy
5,044,030 A 9/1991 Balaton
5,046,267 A 9/1991 Kilgore et al.
5,083,361 A 1/1992 Rudy
5,104,477 A 4/1992 Williams et al.
5,131,174 A 7/1992 Drew et al.
5,155,927 A 10/1992 Bates et al.
5,158,767 A 10/1992 Cohen et al.
5,179,792 A 1/1993 Brantingham
5,193,246 A 3/1993 Huang
5,199,191 A 4/1993 Moumdjian
5,224,277 A 7/1993 Sang Do
5,224,278 A 7/1993 Jeon
5,228,156 A 7/1993 Wang
5,235,715 A 8/1993 Donzis
5,238,231 A 8/1993 Huang
5,245,766 A 9/1993 Warren
5,253,435 A 10/1993 Auger et al.
5,257,470 A 11/1993 Auger et al.
5,297,349 A 3/1994 Kilgore
5,335,382 A 8/1994 Huang
5,337,492 A 8/1994 Anderie et al.
5,353,459 A 10/1994 Potter et al.
5,353,523 A 10/1994 Kilgore et al.
5,355,552 A 10/1994 Huang
5,367,791 A 11/1994 Gross et al.
5,406,719 A 4/1995 Potter
5,425,184 A 6/1995 Lyden et al.
5,493,792 A 2/1996 Bates et al.
5,543,194 A 8/1996 Rudy
5,558,395 A 9/1996 Huang
5,572,804 A 11/1996 Skaja et al.
5,595,004 A 1/1997 Lyden et al.
5,625,964 A 5/1997 Lyden et al.
5,669,161 A 9/1997 Huang
5,686,167 A 11/1997 Rudy
5,704,137 A 1/1998 Dean et al.
5,713,141 A 2/1998 Mitchell et al.
5,741,568 A 4/1998 Rudy
5,753,061 A 5/1998 Rudy
5,755,001 A 5/1998 Potter et al.
5,771,606 A 6/1998 Litchfield et al.
5,802,739 A 9/1998 Potter et al.
5,830,553 A 11/1998 Huang
5,832,630 A 11/1998 Potter
5,846,063 A 12/1998 Lakic
5,902,660 A 5/1999 Huang
5,907,911 A 6/1999 Huang
5,916,664 A 6/1999 Rudy
5,925,306 A 7/1999 Huang
5,937,462 A 8/1999 Huang
5,952,065 A 9/1999 Mitchell et al.
5,975,629 A * 11/1999 Lorbiecki .................... 297/200
5,976,451 A 11/1999 Skaja et al.
5,979,078 A 11/1999 McLaughlin
5,987,780 A 11/1999 Lyden et al.
5,993,585 A 11/1999 Goodwin et al.
6,009,637 A 1/2000 Pavone
6,013,340 A 1/2000 Bonk et al.
6,027,683 A 2/2000 Huang
6,029,962 A 2/2000 Shorten et al.
6,055,746 A 5/2000 Lyden et al.
6,065,150 A 5/2000 Huang

(56) References Cited

U.S. PATENT DOCUMENTS

| | | | | |
|---|---|---|---|---|
| 6,098,313 | A | 8/2000 | Skaja | |
| 6,119,371 | A | 9/2000 | Goodwin et al. | |
| 6,127,010 | A | 10/2000 | Rudy | |
| 6,128,837 | A | 10/2000 | Huang | |
| 6,192,606 | B1 | 2/2001 | Pavone | |
| 6,253,466 | B1 | 7/2001 | Harmon-Weiss et al. | |
| 6,374,514 | B1 | 4/2002 | Swigart | |
| 6,457,262 | B1 | 10/2002 | Swigart | |
| 6,550,085 | B2 | 4/2003 | Roux | |
| 6,665,958 | B2 | 12/2003 | Goodwin | |
| 6,783,184 | B2 | 8/2004 | DiBattista et al. | |
| 6,796,056 | B2 | 9/2004 | Swigart | |
| 6,837,951 | B2 | 1/2005 | Rapaport | |
| 6,889,451 | B2 | 5/2005 | Passke et al. | |
| 6,918,198 | B2 | 7/2005 | Chi | |
| 6,931,764 | B2 | 8/2005 | Swigart et al. | |
| 6,971,193 | B1 | 12/2005 | Potter et al. | |
| 7,000,335 | B2 | 2/2006 | Swigart et al. | |
| 7,051,456 | B2 | 5/2006 | Swigart et al. | |
| 7,070,845 | B2 | 7/2006 | Thomas et al. | |
| 7,073,276 | B2 | 7/2006 | Swigart | |
| 7,076,891 | B2 | 7/2006 | Goodwin | |
| 7,086,179 | B2 | 8/2006 | Dojan et al. | |
| 7,131,218 | B2 | 11/2006 | Schindler | |
| 2004/0069071 | A1 * | 4/2004 | Speckhart et al. | 73/820 |

FOREIGN PATENT DOCUMENTS

| | | |
|---|---|---|
| CA | 727582 | 2/1966 |
| CN | 75100322 | 1/1975 |
| CN | 54221 | 6/1978 |
| DE | 3234086 | 3/1984 |
| DE | G9201758.4 | 4/1992 |
| EP | 0094868 | 11/1983 |
| EP | 0215974 | 4/1987 |
| EP | 0605485 | 7/1994 |
| FR | 1195549 | 11/1959 |
| FR | 1406610 | 7/1965 |
| FR | 2144464 | 2/1973 |
| FR | 2404413 | 4/1979 |
| FR | 2407008 | 5/1979 |
| FR | 2483321 | 12/1981 |
| FR | 2614510 | 11/1988 |
| FR | 2639537 | 6/1990 |
| FR | 2641837 | 7/1990 |
| GB | 7441 | 0/1907 |
| GB | 14955 | 0/1894 |
| GB | 233387 | 5/1925 |
| GB | 978654 | 12/1964 |
| GB | 1128764 | 10/1968 |
| JP | 4266718 | 9/1992 |
| JP | 6181802 | 7/1994 |
| WO | 8910074 | 11/1989 |
| WO | 9010396 | 9/1990 |
| WO | 9111928 | 8/1991 |
| WO | 9111931 | 8/1991 |
| WO | 9208384 | 5/1992 |
| WO | 9520332 | 8/1995 |
| WO | 0119211 | 3/2001 |

OTHER PUBLICATIONS

Brooks Running Catalog, Fall 1991.

European Search Report mailed Nov. 18, 2010 in European Patent Application No. 09176519.8.

* cited by examiner

CONTOURED FLUID-FILLED CHAMBER

CROSS-REFERENCE TO RELATED APPLICATION

This application is a divisional of and claims priority to U.S. patent application Ser. No. 11/746,772, which was filed in the U.S. Patent and Trademark Office on 10 May 2007 and entitled Contoured Fluid-Filled Chamber, such prior U.S. Patent Application being entirely incorporated herein by reference.

BACKGROUND

A conventional article of athletic footwear includes two primary elements, an upper and a sole structure. The upper may be formed from a plurality of material elements (e.g., textiles, leather, and foam materials) that define a void to securely receive and position a foot with respect to the sole structure. The sole structure is secured to a lower surface of the upper and is generally positioned to extend between the foot and the ground. In addition to attenuating ground reaction forces, the sole structure may provide traction and control various foot motions, such as pronation. Accordingly, the upper and the sole structure operate cooperatively to provide a comfortable structure that is suited for a wide variety of ambulatory activities, such as walking and running.

The sole structure of an article of athletic footwear generally exhibits a layered configuration that includes a comfort-enhancing insole, a resilient midsole at least partially formed from a polymer foam material, and a ground-contacting outsole that provides both abrasion-resistance and traction. Suitable polymer foam materials for the midsole include ethylvinylacetate or polyurethane that compresses resiliently under an applied load to attenuate ground reaction forces. Conventional polymer foam materials compress resiliently, in part, due to the inclusion of a plurality of open or closed cells that define an inner volume substantially displaced by gas. Following repeated compressions, the cell structure of the polymer foam may deteriorate, thereby resulting in decreased compressibility and decreased force attenuation characteristics of the sole structure.

One manner of reducing the mass of a polymer foam midsole and decreasing the effects of deterioration following repeated compressions is to incorporate a fluid-filled chamber into the midsole. In general, the fluid-filled chambers are formed from an elastomeric polymer material that is sealed and pressurized. The chambers are then encapsulated in the polymer foam of the midsole such that the combination of the chamber and the encapsulating polymer foam functions as the midsole. In some configurations, textile or foam tensile members may be located within the chamber or reinforcing structures may be bonded to an exterior surface of the chamber to impart shape to or retain an intended shape of the chamber.

Fluid-filled chambers suitable for footwear applications may be manufactured by a two-film technique, in which two separate sheets of elastomeric film are formed to exhibit the overall peripheral shape of the chamber. The sheets are then bonded together along their respective peripheries to form a sealed structure, and the sheets are also bonded together at predetermined interior areas to give the chamber a desired configuration. That is, interior bonds (i.e., bonds spaced inward from the periphery) provide the chamber with a predetermined shape and size upon pressurization. In order to pressurize the chamber, a nozzle or needle connected to a fluid pressure source is inserted into a fill inlet formed in the chamber. Following pressurization of the chamber, the fill inlet is sealed and the nozzle is removed. A similar procedure, referred to as thermoforming, may also be utilized, in which a heated mold forms or otherwise shapes the sheets of elastomeric film during the manufacturing process.

Chambers may also be manufactured by a blow-molding technique, wherein a molten or otherwise softened elastomeric material in the shape of a tube is placed in a mold having the desired overall shape and configuration of the chamber. The mold has an opening at one location through which pressurized air is provided. The pressurized air induces the liquefied elastomeric material to conform to the shape of the inner surfaces of the mold. The elastomeric material then cools, thereby forming a chamber with the desired shape and configuration. As with the two-film technique, a nozzle or needle connected to a fluid pressure source is inserted into a fill inlet formed in the chamber in order to pressurize the chamber. Following pressurization of the chamber, the fill inlet is sealed and the nozzle is removed.

SUMMARY

A fluid-filled chamber may be incorporated into footwear and other products is disclosed below. The chamber is formed from a polymer material that defines a first surface, a second surface located opposite the first surface, and a sidewall surface extending around a periphery of the chamber and between the first surface and the second surface. A plurality of bonds are spaced inward from the sidewall surface and join the first surface and the second surface, and the bonds are distributed to form a regularly-spaced array, such as a hexagonal array. In some configurations, the first surface and the second surface may define elliptically-shaped structures between the bonds.

A method of manufacturing a fluid-filled chamber is also disclosed below. The method includes locating a first sheet and a second sheet of a polymer material between a pair of mold portions. The first sheet and the second sheet are compressed together between the mold portions to form (a) a peripheral bond that joins the first sheet and the second sheet around a periphery of the chamber and (b) a plurality of interior bonds that join the first sheet and the second sheet and are spaced inward from the peripheral bond. In some configurations, the interior bonds may be located to form a regularly-spaced array. In addition, the chamber may be sealed to enclose a fluid within the chamber and between the first sheet and the second sheet.

The advantages and features of novelty characterizing aspects of the invention are pointed out with particularity in the appended claims. To gain an improved understanding of the advantages and features of novelty, however, reference may be made to the following descriptive matter and accompanying drawings that describe and illustrate various embodiments and concepts related to the invention.

DESCRIPTION OF THE DRAWINGS

The foregoing Summary and the following Detailed Description will be better understood when read in conjunction with the accompanying drawings.

DETAILED DESCRIPTION

The following discussion and accompanying figures disclose various configurations of fluid-filled chambers suitable for use in sole structures of articles of footwear. Concepts related to the chambers and the sole structures are disclosed with reference to footwear having a configuration that is suitable for running. The chambers are not limited to footwear designed for running, however, and may be utilized with a wide range of athletic footwear styles, including basketball shoes, tennis shoes, football shoes, cross-training shoes, walking shoes, and soccer shoes, for example. The chambers may also be utilized with footwear styles that are generally considered to be non-athletic, including dress shoes, loafers, sandals, and boots. An individual skilled in the relevant art will appreciate, therefore, that the concepts disclosed herein apply to a wide variety of footwear styles, in addition to the specific style discussed in the following material and depicted in the accompanying figures. In addition to footwear, concepts associated with the fluid-filled chambers may also be applied to a variety of other consumer products.

Footwear Structure

Figure 1:
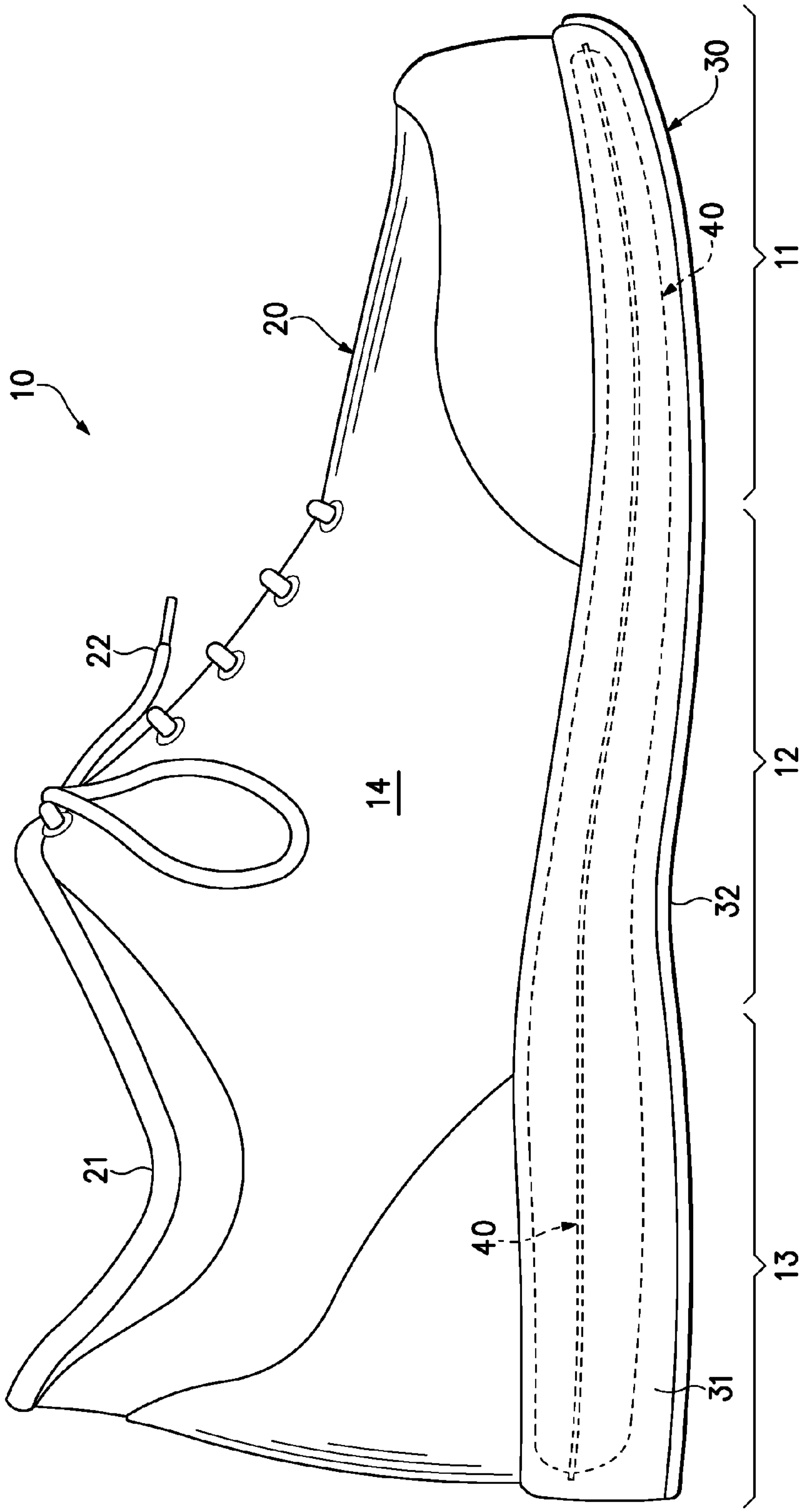
FIG. 1 is a lateral side elevational view of an article of footwear incorporating a fluid-filled chamber.
Figure 2:
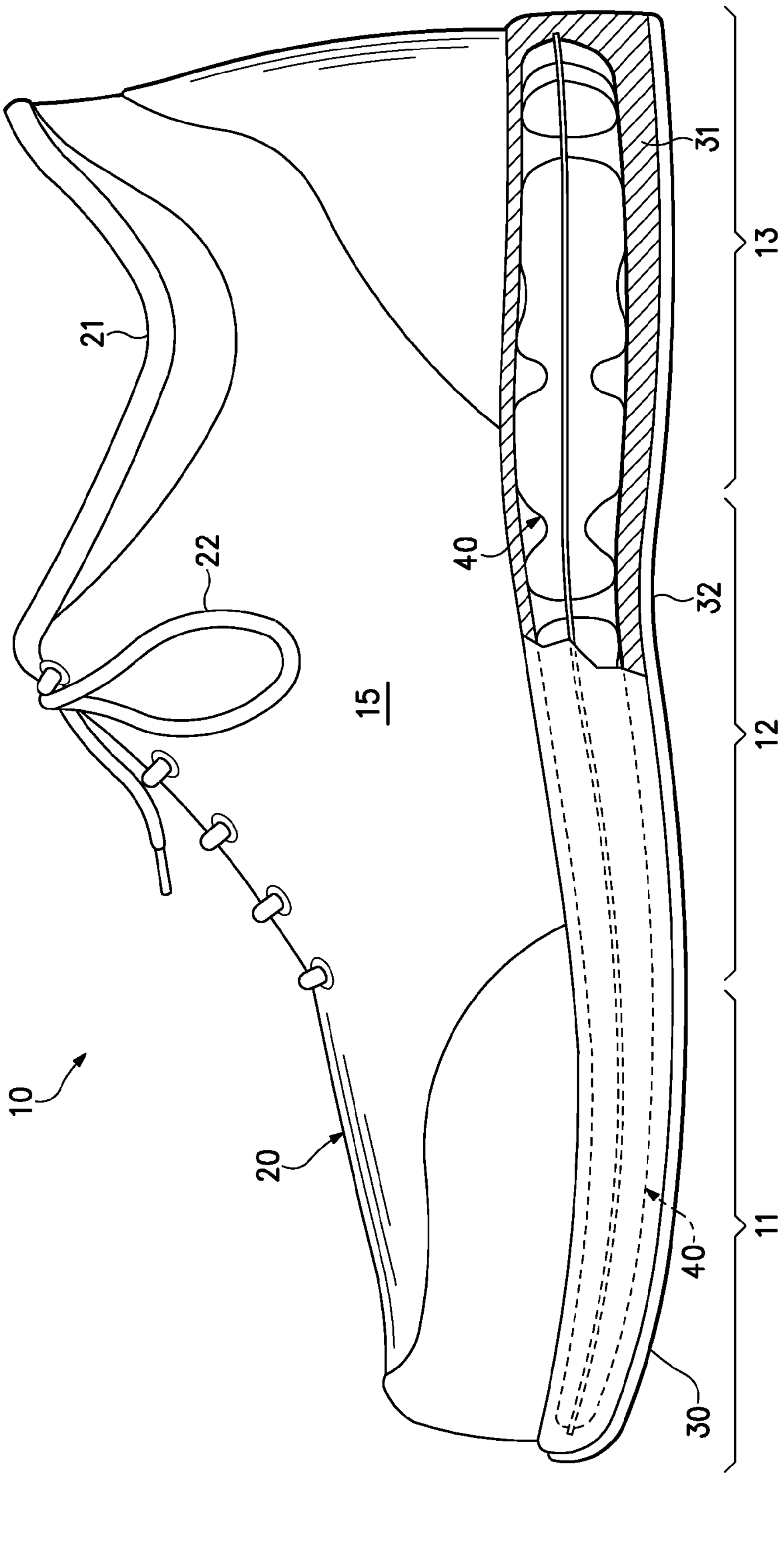
FIG. 2 is a medial side elevational view of the article of footwear incorporating the chamber.
Figure 3:
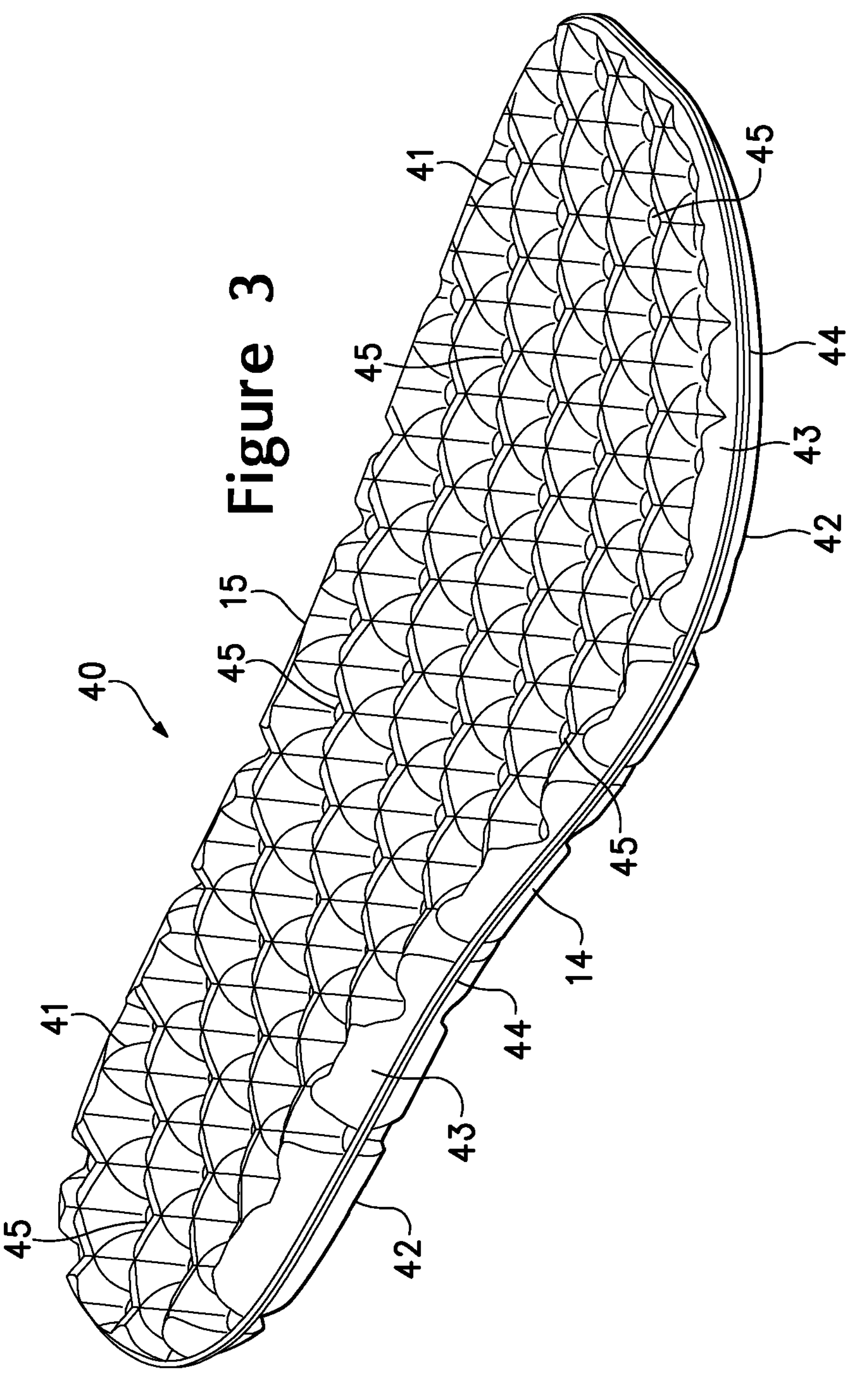
FIG. 3 is a perspective view of the chamber.
Figure 4:
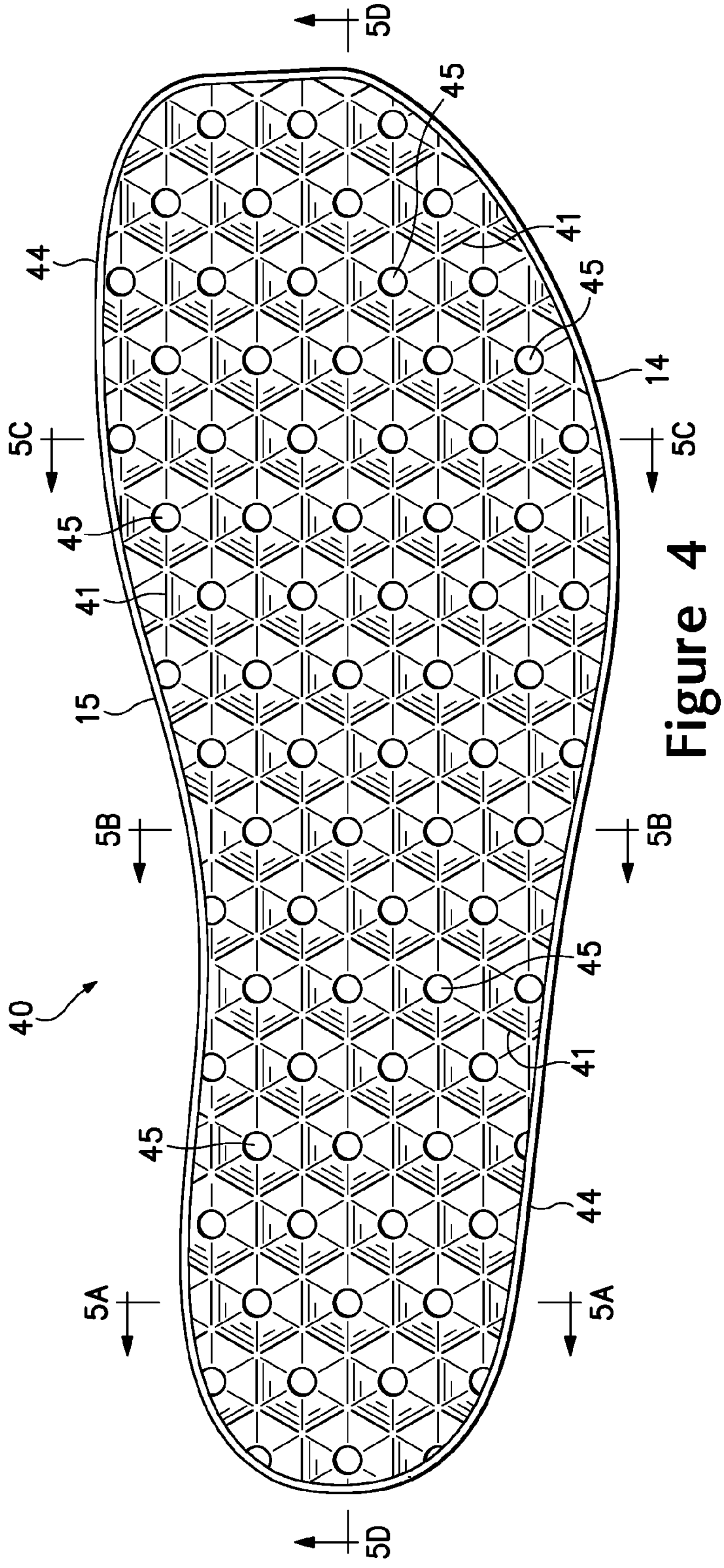
FIG. 4 is a top plan view of the chamber.

An article of footwear 10 is depicted in FIGS. 1 and 2 as including an upper 20 and a sole structure 30. For reference purposes, footwear 10 may be divided into three general regions: a forefoot region 11, a midfoot region 12, and a heel region 13, as shown in FIGS. 1 and 2. Footwear 10 also includes a lateral side 14 and a medial side 15. Forefoot region 11 generally includes portions of footwear 10 corresponding with the toes and the joints connecting the metatarsals with the phalanges. Midfoot region 12 generally includes portions of footwear 10 corresponding with the arch area of the foot, and heel region 13 corresponds with rear portions of the foot, including the calcaneus bone. Lateral side 14 and medial side 15 extend through each of regions 11-13 and correspond with opposite sides of footwear 10. Regions 11-13 and sides 14-15 are not intended to demarcate precise areas of footwear 10. Rather, regions 11-13 and sides 14-15 are intended to represent general areas of footwear 10 to aid in the following discussion. In addition to footwear 10, regions 11-13 and sides 14-15 may also be applied to upper 20, sole structure 30, and individual elements thereof.

Upper 20 is depicted as having a substantially conventional configuration incorporating a plurality material elements (e.g., textiles, foam, leather, and synthetic leather) that are stitched or adhesively bonded together to form an interior void for securely and comfortably receiving a foot. The material elements may be selected and located with respect to upper 20 in order to selectively impart properties of durability, air-permeability, wear-resistance, flexibility, and comfort, for example. An ankle opening 21 in heel region 13 provides access to the interior void. In addition, upper 20 may include a lace 22 that is utilized in a conventional manner to modify the dimensions of the interior void, thereby securing the foot within the interior void and facilitating entry and removal of the foot from the interior void. Lace 22 may extend through apertures in upper 20, and a tongue portion of upper 20 may extend between the interior void and lace 22. Given that various aspects of the present application primarily relate to sole structure 30, upper 20 may exhibit the general configuration discussed above or the general configuration of practically any other conventional or non-conventional upper. Accordingly, the structure of upper 20 may vary significantly within the scope of the present invention.

Sole structure 30 is secured to upper 20 and has a configuration that extends between upper 20 and the ground. The primary elements of sole structure 30 are a midsole 31 and an outsole 32. Midsole 31 may be formed from a polymer foam material, such as polyurethane or ethylvinylacetate, that encapsulates a fluid-filled chamber 40 to enhance the ground reaction force attenuation characteristics of sole structure 30. In addition to the polymer foam material and chamber 40, midsole 31 may incorporate one or more plates, moderators, or reinforcing structures, for example, that further enhance the ground reaction force attenuation characteristics of sole structure 30 or the performance properties of footwear 10. Outsole 32, which may be absent in some configurations of footwear 10, is secured to a lower surface of midsole 31 and may be formed from a rubber material that provides a durable and wear-resistant surface for engaging the ground. Outsole 32 may also be textured to enhance the traction (i.e., friction) properties between footwear 10 and the ground. In addition, sole structure 30 may incorporate an insole or sockliner (not depicted) that is located with in the void in upper 20 and adjacent a plantar (i.e., lower) surface of the foot to enhance the comfort of footwear 10.

Chamber Configuration

Chamber 40 is depicted individually in FIGS. 3-8 as having a configuration that is suitable for footwear applications. When incorporated into footwear 10, chamber 40 has a shape that fits within a perimeter of midsole 31 and substantially extends from forefoot region 11 to heel region 13 and also from lateral side 14 to medial side 15, thereby corresponding with a general outline of the foot. When the foot is located within upper 20, chamber 40 extends under substantially all of the foot in order to attenuate ground reaction forces that are generated when sole structure 30 is compressed between the foot and the ground during various ambulatory activities, such as running and walking.

An exterior of chamber 40 is formed from a polymer material that provides a sealed barrier for enclosing a pressurized fluid. The polymer material defines an upper surface 41, an opposite lower surface 42, and a sidewall surface 43 that extends around a periphery of chamber 40 and between surfaces 41 and 42. As discussed in greater detail below, chamber 40 may be formed from a pair of polymer sheets that are molded and bonded during a thermoforming process to define surfaces 41-43. More particularly, the thermoforming process (a) imparts shape to one of the polymer sheets in order to form upper surface 41 and an upper portion of sidewall surface 43 (b) imparts shape to the other of the polymer sheets in order to form lower surface 42 and a lower portion of sidewall surface 43, (c) forms a peripheral bond 44 that joins a periphery of the polymer sheets and extends around sidewall surface 43, and (d) forms a plurality of interior bonds 45 that join interior portions of the polymer sheets and extends between surfaces 41 and 42. Whereas peripheral bond 44 joins the polymer sheets to form a seal that prevents the fluid from escaping, interior bonds 45 prevent chamber 40 from expanding outward or otherwise distending due to the pressure of the fluid. That is, interior bonds 45 effectively limit the expansion of chamber 40 to retain a contoured shape of surfaces 41 and 42.

Figure 7:
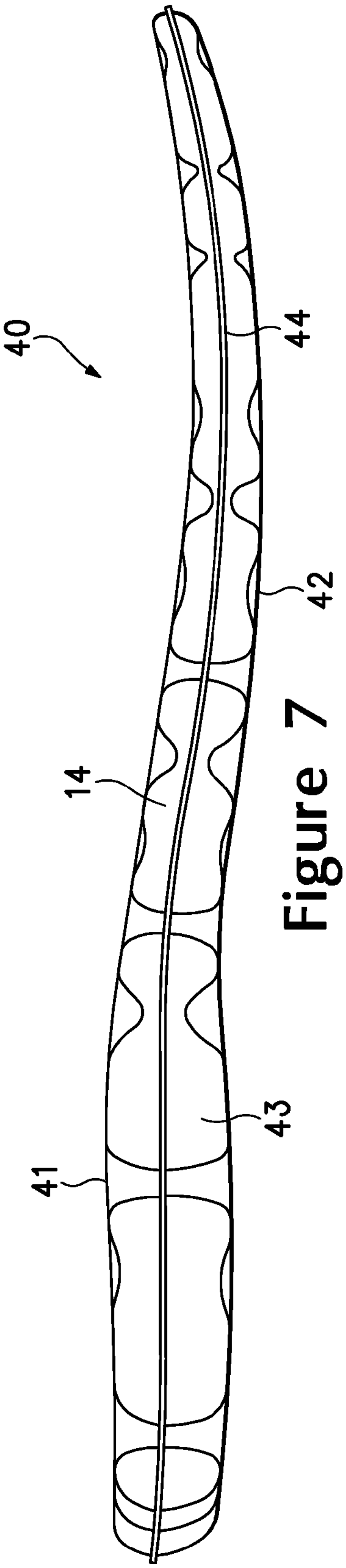
FIG. 7 is a lateral side elevational view of the chamber.
Figure 8:
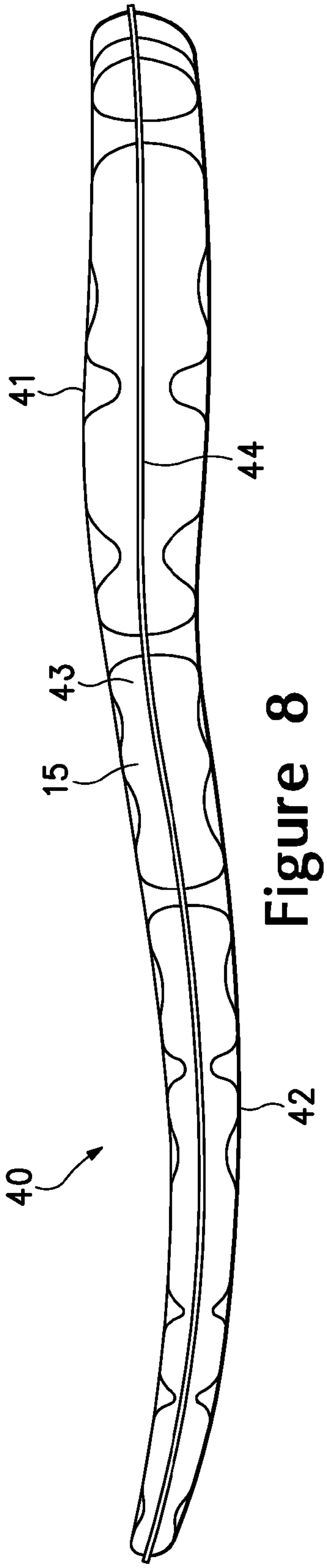
FIG. 8 is a medial side elevational view of the chamber.

Chamber 40 is shaped and contoured to provide a structure that is suitable for footwear applications. As noted above, chamber 40 has a shape that fits within a perimeter of midsole 31 and extends under substantially all of the foot, thereby corresponding with a general outline of the foot. In addition, surfaces 41 and 42 are contoured in a manner that is suitable for footwear applications. With reference to FIGS. 7 and 8, chamber 40 exhibits a tapered configuration between heel region 13 and forefoot region 11. That is, the portion of chamber 40 in heel region 13 exhibits a greater overall thickness than the portion of chamber 40 in forefoot region 11. Chamber 40 also has a configuration wherein the portion of chamber 40 in heel region 13 is generally at a greater elevation than the portion of chamber 40 in forefoot region 11. More particularly, the portion of upper surface 41 in heel region 13 is raised above the portion of upper surface 41 in forefoot region 11, and the portion of lower surface 42 in heel region 13 is raised above the portion of lower surface 42 in forefoot region 11. The tapering of chamber 40 and the differences in elevations in areas of upper surface 41 impart an overall contour to chamber 40 that complements the general anatomical structure of the foot. That is, these contours ensure that the heel of the foot is slightly raised in relation to the forefoot.

Figures 5A, 5B, 5C, 5D:
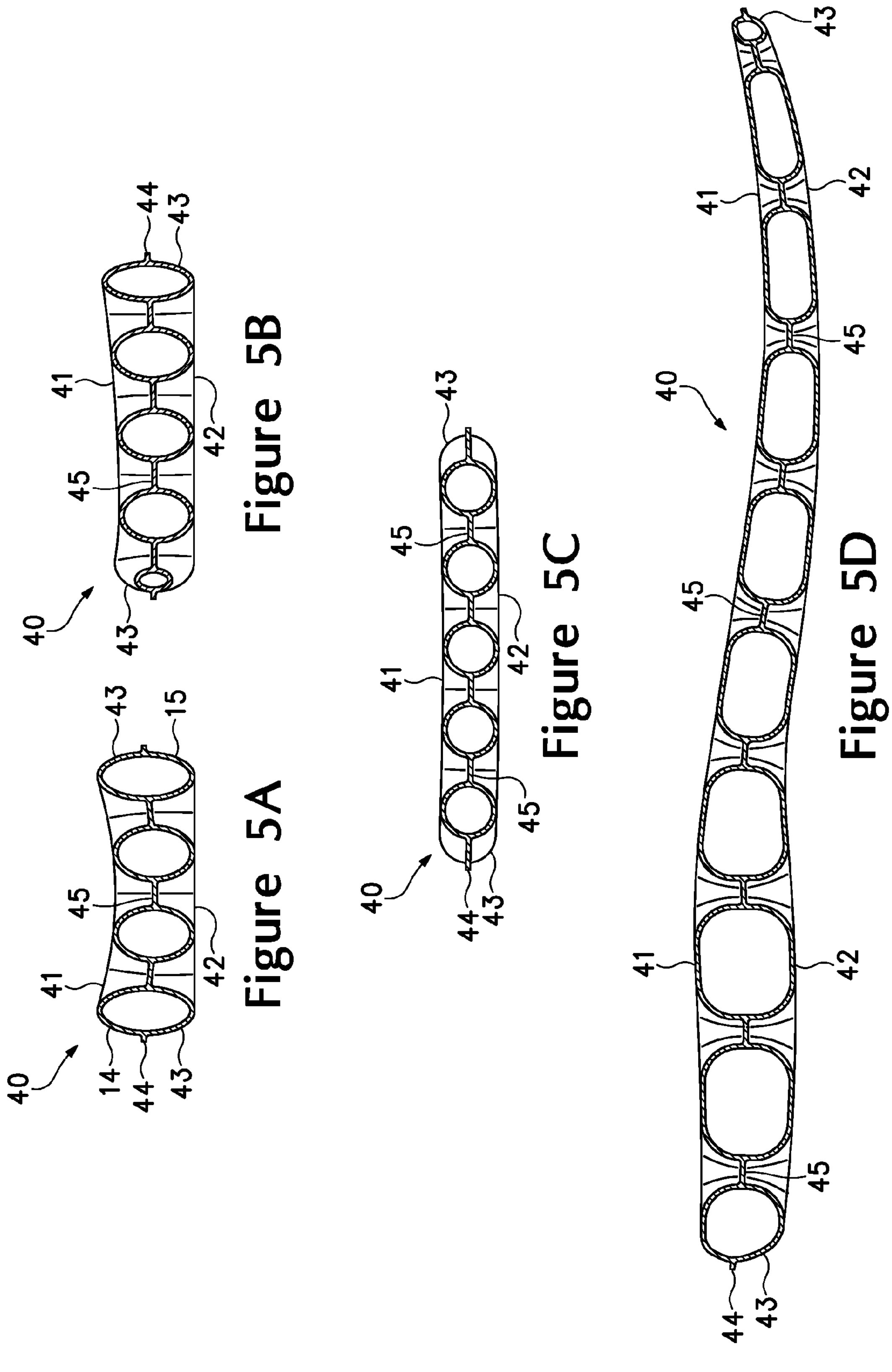
FIGS. 5A-5D are a cross-sectional views of the chamber, as defined by section lines 5A-5D in FIG. 4.
Figure 6:
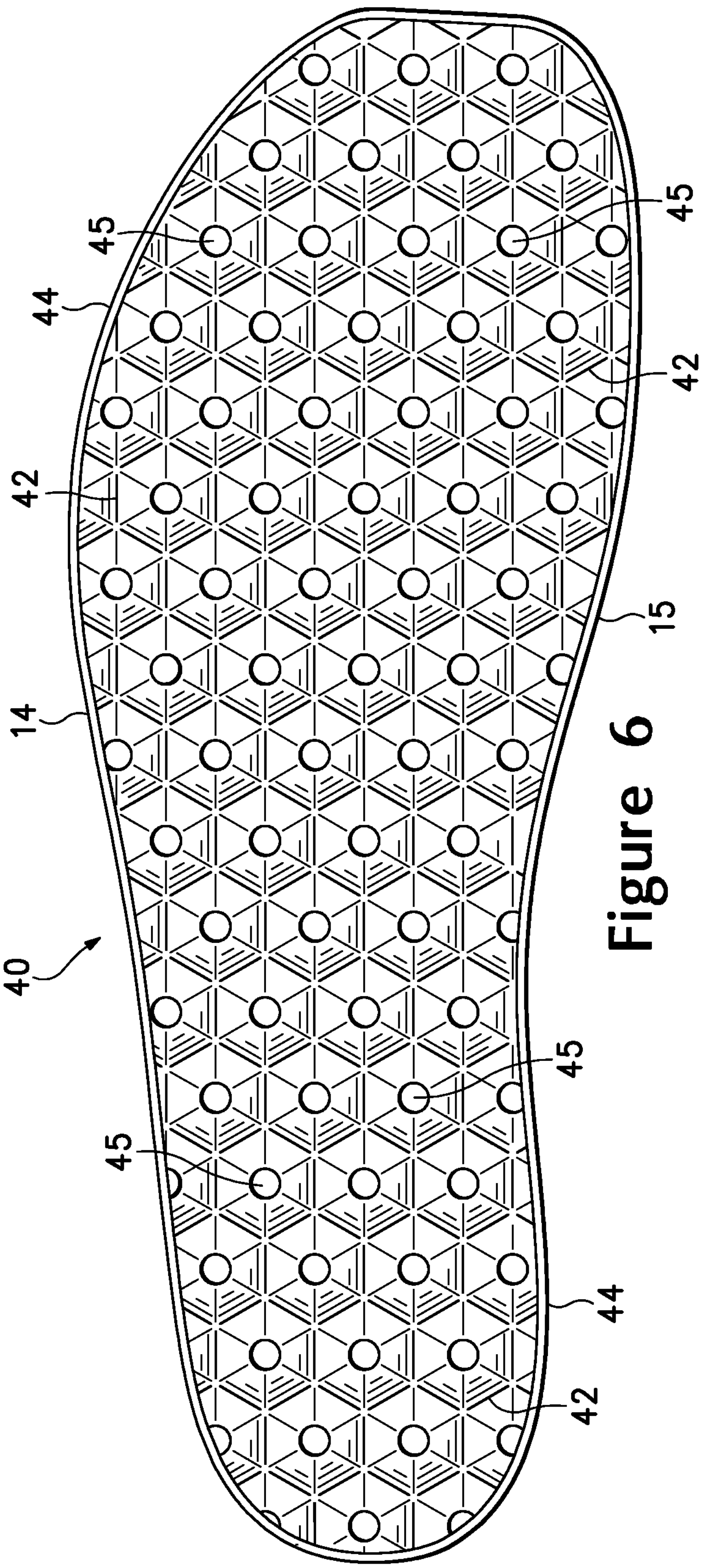
FIG. 6 is a bottom plan view of the chamber.

In addition to tapering and changes in elevation between regions 11 and 13, upper surface 41 is contoured to provide support for the foot. Whereas lower surface 42 is generally planar between sides 14 and 15, upper surface 41 forms a depression in heel region 13 for receiving the heel of the foot, as depicted in FIG. 5A. That is, the heel of the foot may rest within the depression to assist with securing the position of the foot relative to chamber 40. Upper surface 41 may also protrude upward in the portion of midfoot region 12 corresponding with medial side 15 in order to support the arch of the foot, as depicted in FIG. 5B. In addition, upper surface 41 has a generally planar configuration in forefoot region 11 for supporting forward portions of the foot, as depicted in FIG. 5C. Accordingly, upper surface 41 defines various contours to further complement the general anatomical structure of the foot.

Interior bonds 45 are regularly-spaced from each other and arranged to form a hexagonal array. That is, many of interior bonds 45 are surrounded by six other interior bonds 45 that form a hexagonal shape. As discussed in greater detail below, however, interior bonds 45 may be arranged in a triangular array, a square array, a rectangular array, or in an irregular distribution. Interior bonds 45 may also be arranged in an array that includes a combination of different arrays (e.g., a combination of hexagonal and triangular arrays). Depending upon various factors that include the overall dimensions of chamber 40, the thickness of chamber 40, and the pressure of the fluid within chamber 40, for example, the distance between adjacent interior bonds 45 may vary from two to thirty millimeters or more. Depending upon similar factors, the diameter of each interior bond may be five millimeters, but may also range from two to ten millimeters or more. Although interior bonds 45 are depicted as being circular, other shapes may be utilized.

FIGS. 5A-5D depict various cross-sections through chamber 40 and illustrate the configuration of upper surface 41 and lower surface 42 between adjacent interior bonds 45. In heel region 13, the polymer material of surfaces 41 and 42 cooperatively form two elliptically-shaped structures between each of the adjacent interior bonds 45 in heel region 13, as depicted in FIG. 5A. Two additional elliptically-shaped structures are also formed between sidewall surface 43 and interior bonds 45 that are adjacent to sidewall surface 43. Each of the four elliptically-shaped structures are oriented such that a long axis extends vertically, whereas a short axis extends between the adjacent interior bonds 45 or between sidewall surface 43 and interior bonds 45. In midfoot region 12, the polymer material of surfaces 41 and 42 cooperatively form five elliptically-shaped structures that are also oriented such that a long axis extends vertically, as depicted in FIG. 5B. In comparison with the elliptically-shaped structures in heel region 13, however, the elliptically-shaped structures in midfoot region 12 are somewhat less eccentric. That is, the elliptically-shaped structures in heel region 13 have a greater height to width ratio than the elliptically-shaped structures in midfoot region 12. In forefoot region 11, the polymer material of surfaces 41 and 42 cooperatively form five elliptically-shaped structures that are effectively circular in shape, as depicted in FIG. 5C. In comparison with the elliptically-shaped structures in midfoot region 12 and heel region 13, therefore, the elliptically-shaped structures in forefoot region 11 are less eccentric.

The differences in eccentricity between the elliptically-shaped structures of regions 11-13 relates to the differences in vertical thickness of chamber 40 in regions 11-13. Given that the spacing between adjacent interior bonds 45 is the same for each of regions 11-13, the width of each of the elliptically-shaped structures in regions 11-13 is substantially constant. Given that the vertical thickness of chamber 40 is different in each of regions 11-13, however, the length or vertical height of each of the elliptically-shaped structures changes between regions 11-13. More particularly, the elliptically-shaped structures exhibit greater eccentricity in areas of chamber 40 with greater thickness, and the elliptically-shaped structures exhibit lesser eccentricity in areas of chamber 40 with lesser thickness.

When the fluid within chamber 40 is pressurized, the fluid places an outward force upon the polymer material forming surfaces 41 and 42. Although the shape of chamber 40 does not change significantly between the pressurized and unpressurized states, the outward force of the fluid expands or otherwise distends chamber 40 to a relatively small degree. One attribute of chamber 40 that contributes to the relatively small degree of expansion or distension is the presence of the elliptically-shaped structures between adjacent interior bonds 45. That is, the elliptically-shaped structures provide a relatively stable configuration that resists deformation to a greater degree than some other shapes. Moreover, elliptically-shaped structures with a height to width ratio equal to or greater than one (i.e., the vertical height is greater than or equal to the width) are more stable in chamber 40 than elliptically-shaped structures with a height to width ratio less than one (i.e., the vertical height is less than the width). Referring to the cross-sections of FIGS. 5A-5C, each of the elliptically-shaped structures exhibit a height to width ratio equal to or greater than one. Accordingly, the elliptically-shaped structures in chamber 40 are relatively stable.

As noted above, one factor that is relevant to determining a proper distance between adjacent interior bonds 45 is the thickness of chamber 40. When the thickness of chamber 40 is greater than or equal to the distance between edges of adjacent interior bonds 45, the elliptically-shaped structures exhibit a height to width ratio equal to or greater than one. As discussed above, the thickness of chamber 40 is greater than or equal to the distance between edges of adjacent interior bonds 45 in a majority of chamber 40 to impart greater height than thickness to a majority of the elliptically-shaped structures, thereby forming the elliptically-shaped structures to be relatively stable when chamber 40 is pressurized with the fluid. If, however, the thickness of chamber 40 is less than the distance between edges of adjacent interior bonds 45, the elliptically-shaped structures may exhibit a height to width ratio less than one. In some configurations of chamber 40, a majority or all of the elliptically-shaped structures may exhibit a height to width ratio less than one.

The polymer material forming the exterior or outer barrier of chamber 40 encloses a fluid pressurized between zero and three-hundred-fifty kilopascals (i.e., approximately fifty-one pounds per square inch) or more. In addition to air and nitrogen, the fluid contained by chamber 40 may include octafluorapropane or be any of the gasses disclosed in U.S. Pat. No. 4,340,626 to Rudy, such as hexafluoroethane and sulfur hexafluoride, for example. In some configurations, chamber 40 may incorporate a valve that permits the individual to adjust the pressure of the fluid.

A wide range of polymer materials may be utilized for chamber 40. In selecting materials for the outer barrier of chamber 40, engineering properties of the material (e.g., tensile strength, stretch properties, fatigue characteristics, dynamic modulus, and loss tangent) as well as the ability of the material to prevent the diffusion of the fluid contained by chamber 40 may be considered. When formed of thermoplastic urethane, for example, the outer barrier of chamber 40 may have a thickness of approximately 1.0 millimeter, but the thickness may range from 0.25 to 2.0 millimeters or more, for example. In addition to thermoplastic urethane, examples of polymer materials that may be suitable for chamber 40 include polyurethane, polyester, polyester polyurethane, and polyether polyurethane. Chamber 40 may also be formed from a material that includes alternating layers of thermoplastic polyurethane and ethylene-vinyl alcohol copolymer, as disclosed in U.S. Pat. Nos. 5,713,141 and 5,952,065 to Mitchell, et al. A variation upon this material may also be utilized, wherein a center layer is formed of ethylene-vinyl alcohol copolymer, layers adjacent to the center layer are formed of thermoplastic polyurethane, and outer layers are formed of a regrind material of thermoplastic polyurethane and ethylene-vinyl alcohol copolymer. Another suitable material for chamber 40 is a flexible microlayer membrane that includes alternating layers of a gas barrier material and an elastomeric material, as disclosed in U.S. Pat. Nos. 6,082,025 and 6,127,026 to Bonk, et al. Additional suitable materials are disclosed in U.S. Pat. Nos. 4,183,156 and 4,219,945 to Rudy. Further suitable materials include thermoplastic films containing a crystalline material, as disclosed in U.S. Pat. Nos. 4,936,029 and 5,042,176 to Rudy, and polyurethane including a polyester polyol, as disclosed in U.S. Pat. Nos. 6,013,340; 6,203,868; and 6,321,465 to Bonk, et al.

Design Process

Figure 9:
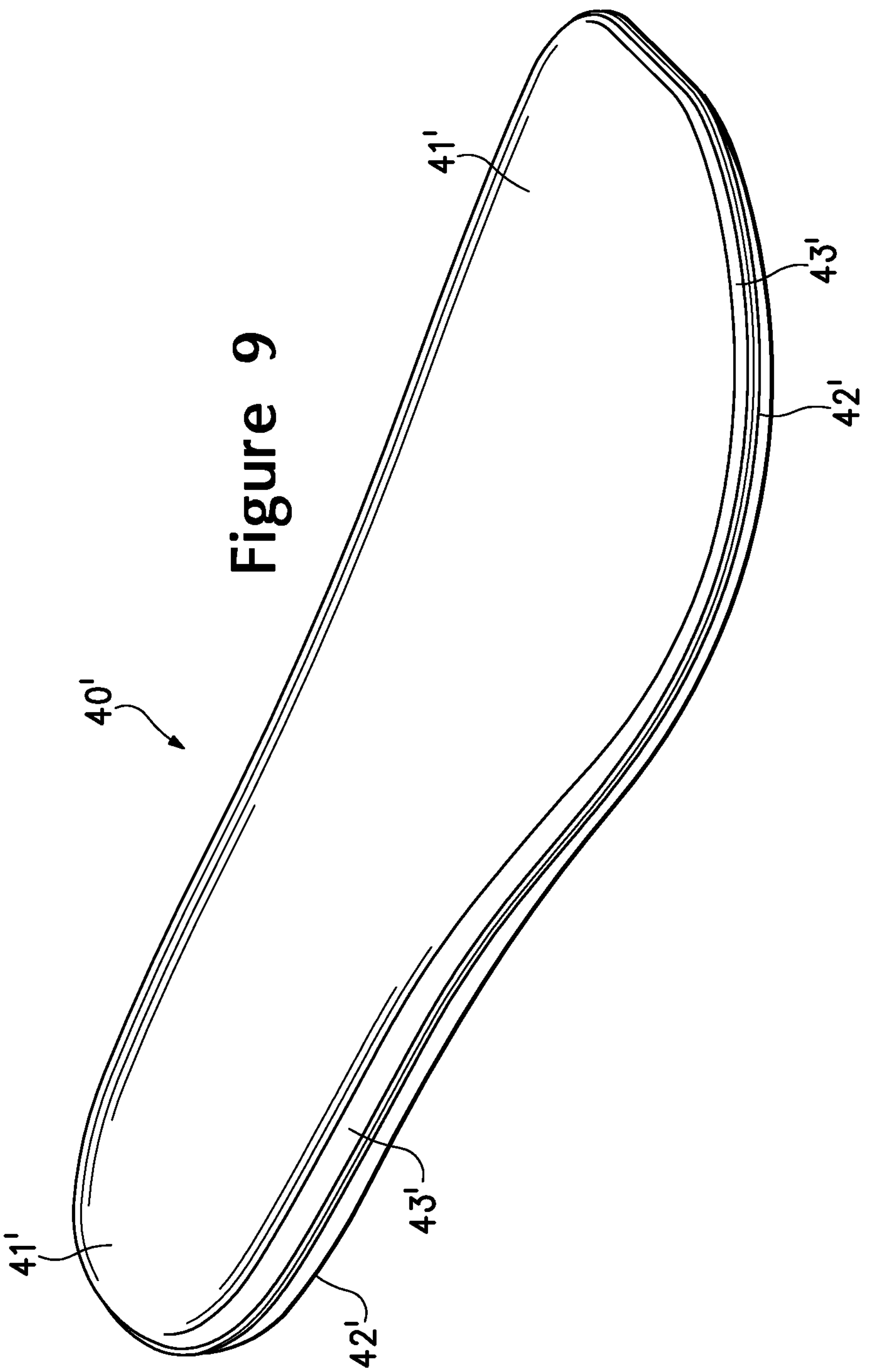
FIG. 9 is a perspective depicting an alternate configuration of the chamber.

An alternate chamber configuration is depicted in FIG. 9 as chamber 40'. An exterior of chamber 40' is formed from a polymer material that provides a sealed barrier for enclosing a fluid. The polymer material defines an upper surface 41', an opposite lower surface 42', and a sidewall surface 43' that extends around a periphery of chamber 40' and between surfaces 41' and 42'. In comparison with chamber 40, interior bonds 45 are absent from chamber 40', thereby imparting a smooth aspect to surfaces 41' and 42' due to the lack of indentations associated with interior bonds 45. As with chamber 40, chamber 40' tapers between heel and forefoot regions, incorporates differences in elevation in areas of upper surface 41', provides an indentation in the heel region and a protrusion in the midfoot region, and has a generally planar configuration in the forefoot region. Accordingly, with the exception of the absence of interior bonds 45 and the indentations associated with interior bonds 45, the shape of chamber 40' is substantially identical to chamber 40.

A further difference between chambers 40 and 40' relates to fluid pressures. More particularly, the fluid pressure that may be contained within chamber 40' is substantially reduced in comparison with chamber 40. As the pressure within chamber 40' increases beyond thirty-five kilopascals (i.e., approximately five pounds per square inch), for example, chamber 40' may begin to expand outward or otherwise distend because interior bonds 45 are absent and do not restrict the expansion. More particularly, relatively moderate to high pressures in chamber 40' may cause surfaces 41' and 42' to distend outward until chamber 40' takes on a generally cylindrical or bulbous shape. The absence of interior bonds 45 effectively limits, therefore, the fluid pressure within chamber 40' to relatively low levels. The absence of interior bonds 45 may also permit changes in the shape of chamber 40' during use. For example, a compressive force upon the heel region of chamber 40' may increase the overall fluid pressure within chamber 40', thereby inducing the forefoot region of chamber 40' to expand or distend outward. Accordingly, chamber 40' may exhibit a decreased resistance to deformation during use when interior bonds 45 are absent.

In applications where the fluid pressure may be relatively low, chamber 40' may be utilized in footwear 10. In applications where a relatively high fluid pressure may be beneficial, however, chamber 40 is utilized in footwear 10 because interior bonds 45 and the elliptically-shaped structures prevent surfaces 41 and 42 from expanding outward or otherwise distending significantly due to the pressure of the fluid. Through application of the design process discussed below, chamber 40' may be modified through the addition of interior bonds 45 in order to form chamber 40. That is, the design considerations discussed below may be utilized to (a) modify the shape of chamber 40', which may only be utilized with relatively low fluid pressures, and (b) arrive at the shape of chamber 40, which includes interior bonds 45, the elliptically-shaped structures that permit relatively moderate to high fluid pressures, and contouring to complement the general anatomical structure of the foot.

Figure 10:
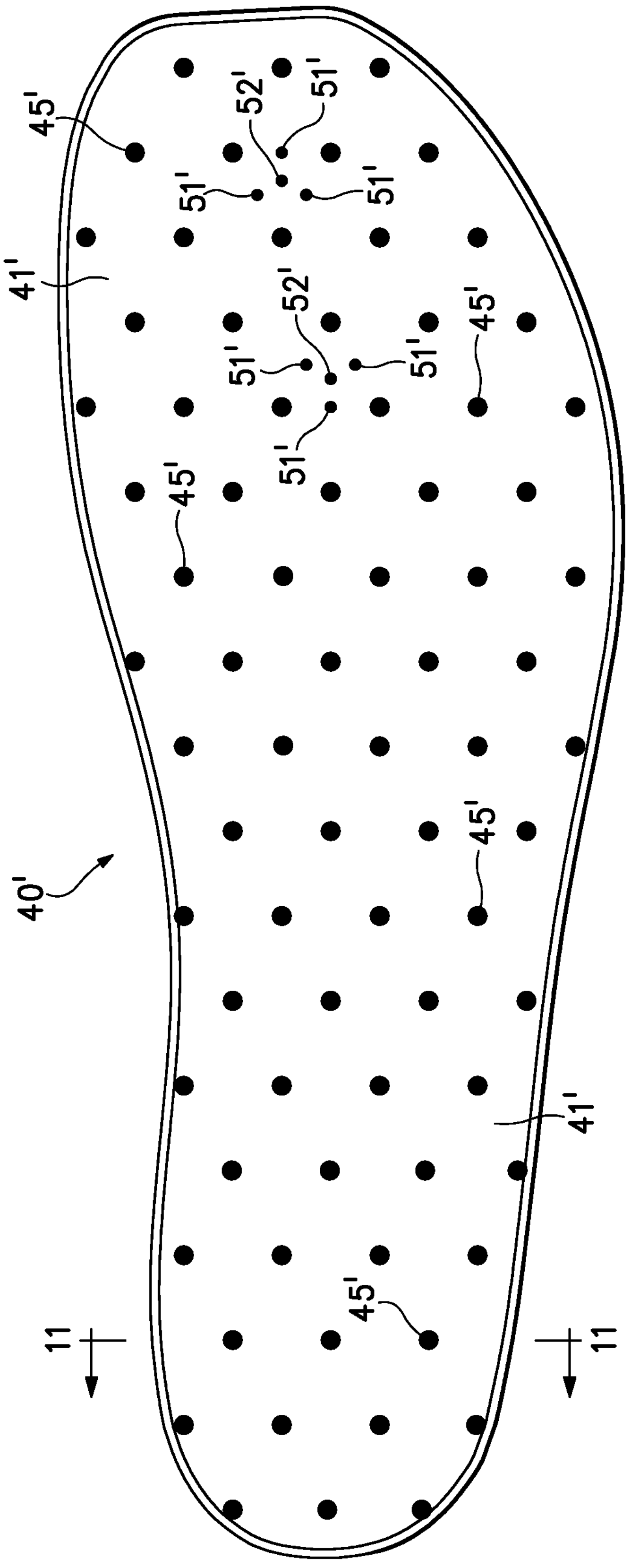
FIG. 10 is a top plan view of the alternate configuration of the chamber.

A first step in the design process for chamber 40 is to determine the positions of interior bonds 45. Referring to FIG. 10, a top plan view of chamber 40' is shown as including a plurality of points 45' that are distributed to form a hexagonal array. Although a triangular array, a square array, a rectangular array, or an irregular distribution may be utilized for interior bonds 45, an advantage to utilizing a hexagonal array is that a distance between adjacent interior bonds 45 is more regular than with other types of arrays. That is, a hexagonal array exhibits more uniform spacing than other types of arrays. Although the hexagonal array may be shifted in any direction or rotated, one of points 45' is depicted as being generally located at a center of the heel region of chamber 40' and some of adjacent points 45' are aligned to extend in the medial-lateral direction.

Another consideration relating to determining the positions of interior bonds 45 is the spacing between adjacent interior bonds 45. Although the spacing between interior bonds 45 may vary significantly, the spacing has an effect upon the stability of the elliptically-shaped structures upon inflation. More particularly, the elliptically-shaped structures may be most stable when interior bonds 45 are spaced from each other such that the thickness in a majority of chamber 40 is greater than or equal to the distance between edges of the adjacent interior bonds 45, as discussed above. Although interior bonds 45 may have any shape and width, assume for purposes of an example that interior bonds 45 have a circular shape with a five millimeter diameter. Also assume that the minimum thickness of chamber 40' is ten millimeters in areas that are not immediately adjacent the edges of chamber 40', where the thickness effectively drops to zero. In this example, the spacing between adjacent points 45' should be at most fifteen millimeters because the distance between edges of the resulting interior bonds 45 will be ten millimeters. That is, spacing points 45' at a distance that is the sum of (a) the thickness of the minimum thickness of chamber 40' and (b) two radii of interior bonds 45 will impart the elliptically-shaped structures with a width that is equal to or less than the thickness. Accordingly, through strategic planning when determining the positions of points 45', the resulting distance between edges of adjacent interior bonds 45 may be equal to or less than the thickness in a majority of chamber 40', thereby imparting relatively high stability to the elliptically-shaped structures upon pressurization. In some configurations, however, advantages may arise if the distance between edges of adjacent interior bonds 45 is greater than the thickness of chamber 40'. That is, the elliptically-shaped structures may have a greater width than height in some configurations.

Once the positions of points 45' (i.e., the positions of interior bonds 45) are determined, a second step in the design process for chamber 40 is to determine the vertical position and angle of interior bonds 45. In manufacturing chamber 40, as described in greater detail below, polymer sheets are heated, shaped, and bonded in various locations. In shaping the polymer sheets, the sheets are drawn into the areas of interior bonds 45. By properly positioning and angling interior bonds 45, changes in the thickness of the polymer sheets may be controlled such that each of the polymer sheets and different areas of the polymer sheets have optimized thicknesses. Accordingly, properly determining the vertical positions and angles for each of interior bonds 45 contributes to ensuring that the polymer material of chamber 40 has a suitable thickness in each area of chamber 40. Referring to FIG. 5A, interior bonds 45 located adjacent peripheral bond 44 are angled relative to a horizontal plane, and interior bonds 45 located in a center of chamber 40 are generally parallel to the horizontal plane.

Although interior bonds 45 may be located closer to one of upper surface 41 and lower surface 42, interior bonds 45 are generally centered between surfaces 41 and 42. Centering interior bonds 45 between surfaces 41 and 42 contributes to ensuring that the degree to which (a) the polymer material forming upper surface 41 is drawn downward and (b) the polymer material forming lower surface 42 is drawn upward are substantially equal. That is, the amount of stretching in the polymer material is substantially equal when interior bonds 45 are located equally between surfaces 41 and 42. In some configurations, substantially equal stretching of the polymer materials forming upper surface 41 and lower surface 42 may contribute to optimizing the thickness in each area of chamber 40. Referring to FIGS. 5A-5D, the various interior bonds 45 are generally centered between surfaces 41 and 42.

Figure 11A:
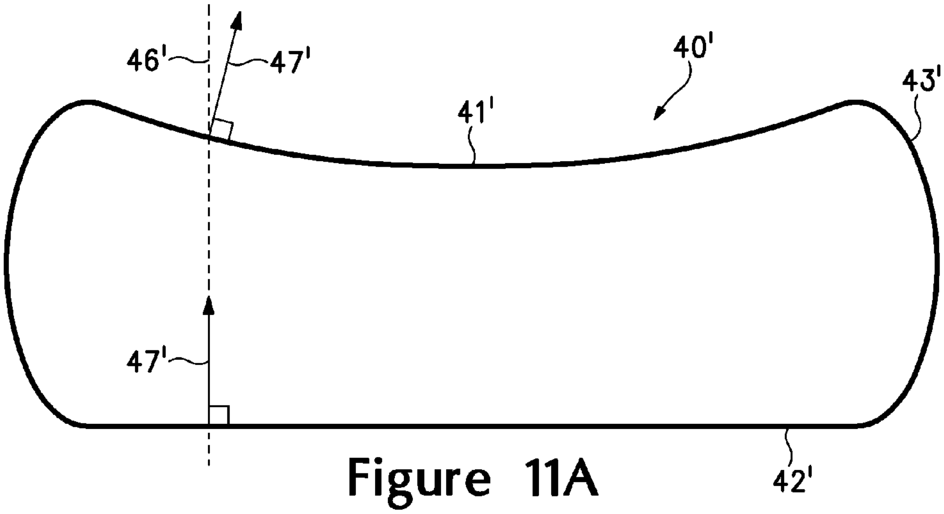
FIGS. 11A-11C are schematic cross-sectional views, as defined by section line 11-11 in FIG. 10 and illustrating a method of designing a structure of the chamber.
Figure 11B:
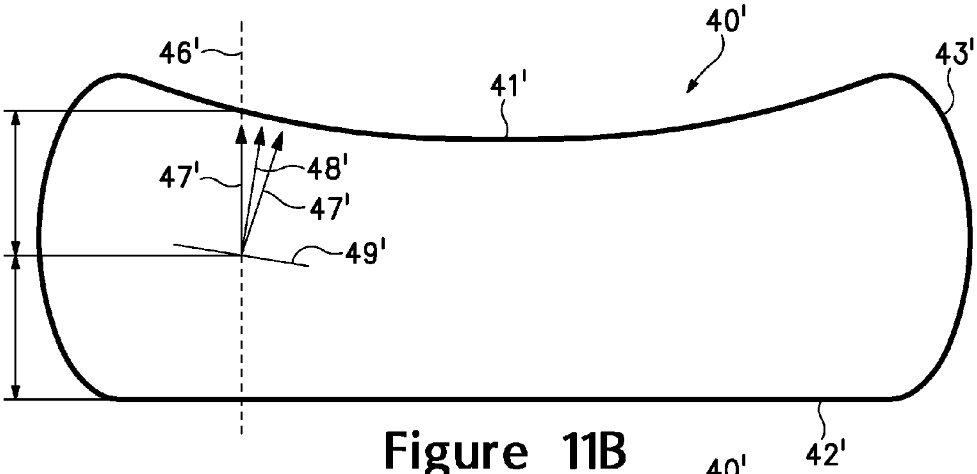

The angle of interior bonds 45 is generally an average of the slope of surfaces 41 and 42. Referring to FIG. 11A, a cross-section through chamber 40' in the heel region is depicted. For purposes of reference, a line 46' extends through chamber 40' in a position of one of points 45' (i.e., in a position where one of interior bonds 45 will be formed). A unit vector 47' is depicted at each of surfaces 41' and 42' as extending outward in a perpendicular direction from surfaces 41' and 42'. That is, unit vectors 47' are normal to surfaces 41' and 42'. Referring to FIG. 11B, unit vectors 47' are shifted to an area that is centered between surfaces 41' and 42', and a resulting vector 48' is shown as being the average of the two unit vectors 47'. That is, unit vectors 47' are averaged to determine the directions associated with resulting vector 48'. The angle of the interior bond 45 at this position is then calculated as being normal to resulting vector 48' and is depicted in FIG. 11B as line 49'. As an alternative to this process, the slopes of surfaces 41' and 42' may be determined at each location where line 46' intersects surfaces 41' and 42', and an average of the slopes may be utilized to determine the slope or angle of the interior bond 45 at this location.

Figure 11C:
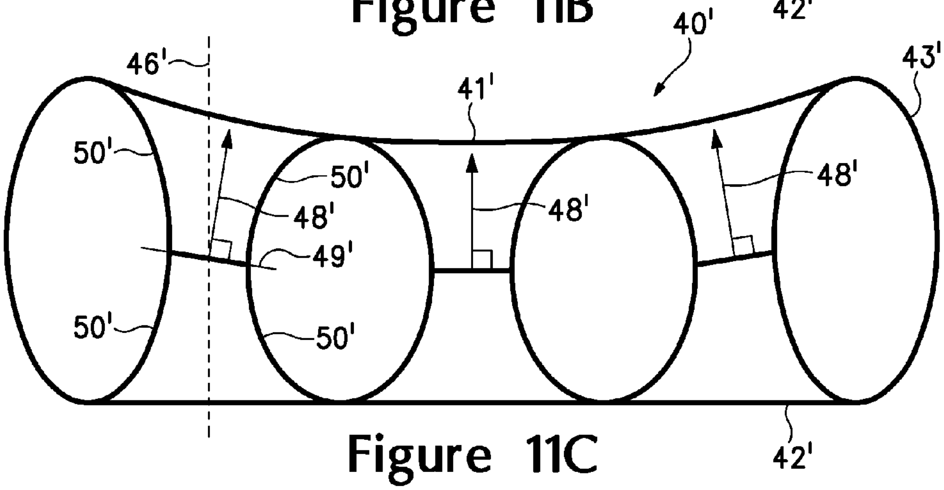

Once the angles of all interior bonds 45 are determined utilizing the general process discussed above, a third step in the design process for chamber 40 is to determine the shapes of surfaces 41 and 42. More particularly, the third step involves the design of the elliptically-shaped structures between the adjacent interior bonds 45. Referring to FIG. 11C, various arcs 50' extend upward and downward from line 49' to define the shape of portions of the elliptically-shaped structures. When combined with similar arcs 50' from adjacent bonds 45, the configurations of the various elliptically-shaped structures are defined.

As a fourth step in the design process for chamber 40, differences in the manner that various areas of chamber 40 will expand or otherwise distend upon inflation may be accounted for. Referring to the forefoot region of FIG. 10, various points 51' and 52' are defined. While each of points 51' and 52' are centered between adjacent points 45', points 51' are closer to the adjacent points 45' than points 52'. That is, points 51' are centered between two adjacent points 45', whereas points 52' are centered between three adjacent points 45'. Upon pressurization, the polymer material of chamber 40 will expand or otherwise distend outward, and the greatest expansion will occur in areas that are furthest from interior bonds 45. That is, the areas in chamber 40 corresponding with points 52' will experience greater expansion than the areas in chamber 40 corresponding with points 51'. In order to account for these differences in expansion, the design process may include adjustments to the relative elevations of areas corresponding with points 52'. That is, the areas corresponding with points 52' on upper surface 41 may be formed to have a lower elevation (e.g., one-third to one millimeter) than the areas corresponding with points 51', and the areas corresponding with points 52' on lower surface 42 may be formed to have a higher elevation (e.g., one-third to one millimeter) than the areas corresponding with points 51'. Upon pressurization of chamber 40, therefore, the areas corresponding with points 52' will expand outward to have an elevation that corresponds with points 51', thereby forming more uniform surfaces in chamber 40.

The design process discussed above, begins with an idealized chamber configuration (i.e., chamber 40'), which may not be suitable for relatively moderate to high fluid pressures. Following various steps that include (a) laying out an array of points, (b) determining the vertical position and angle of interior bonds 45, (c) shaping surfaces 41 and 42 to have the elliptically-shaped structures, and (d) adjusting the shape to account for differences in expansion, chamber 40 is formed to have a configuration that may be more suitable for relatively moderate to high fluid pressures.

Although the design process discussed above may be performed through manual calculations, a computer program may also be written or modified to perform the design process. For example, the shape of chamber 40' may be input into the computer program by the individual, and all other calculations may be performed by the program, including determining positions for points 45', the angles of bonds 45, the shapes of the elliptically-shaped structures, and adjustments to ensure equal elevations for points corresponding with points 51' and 52'.

Manufacturing Method

A thermoforming process may be utilized to manufacture chamber 40. As noted above, the thermoforming process forms chamber 40 from a pair of polymer sheets that are molded and bonded to define surfaces 41-43. More particularly, the thermoforming process (a) imparts shape to one of the polymer sheets in order to form upper surface 41 and an upper portion of sidewall surface 43 (b) imparts shape to the other of the polymer sheets in order to form lower surface 42 and a lower portion of sidewall surface 43, (c) forms peripheral bond 44 to join a periphery of the polymer sheets, and (d) forms interior bonds 45 to join interior portions of the polymer sheets between surfaces 41 and 42.

Figure 12:
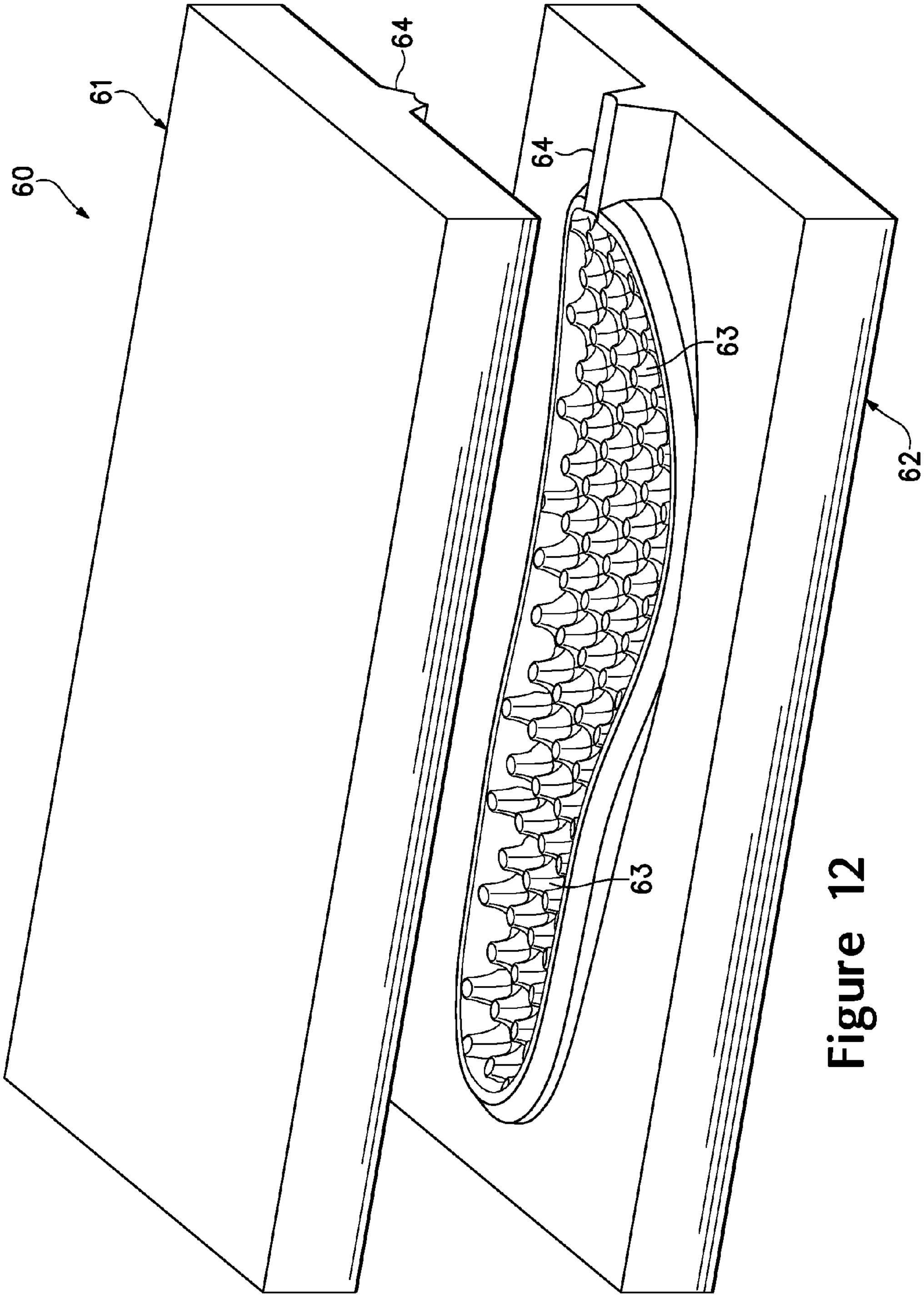
FIG. 12 is a perspective view of a mold for forming the chamber.

Utilizing the configuration of chamber 40 that is designed from the idealized shape of chamber 40' and with the design process discussed above, a mold 60 having an upper mold portion 61 and a lower mold portion 62 may be formed to have the configuration depicted in FIG. 12. Each of mold portions 61 and 62 cooperatively define an internal cavity 63 with the configuration of chamber 40. When mold portions 61 and 62 are joined together, therefore, cavity 63 has dimensions substantially equal to the exterior dimensions of chamber 40 in the unpressurized state. In other configurations, mold portions 61 and 62 may cooperatively define two internal cavities 63, one having the configuration of chamber 40, which is suitable for footwear 10 when configured for the right foot of the individual, and the other having the configuration of a mirror image of chamber 40, which is suitable for footwear 10 when configured for the left foot of the individual.

Figure 13A:
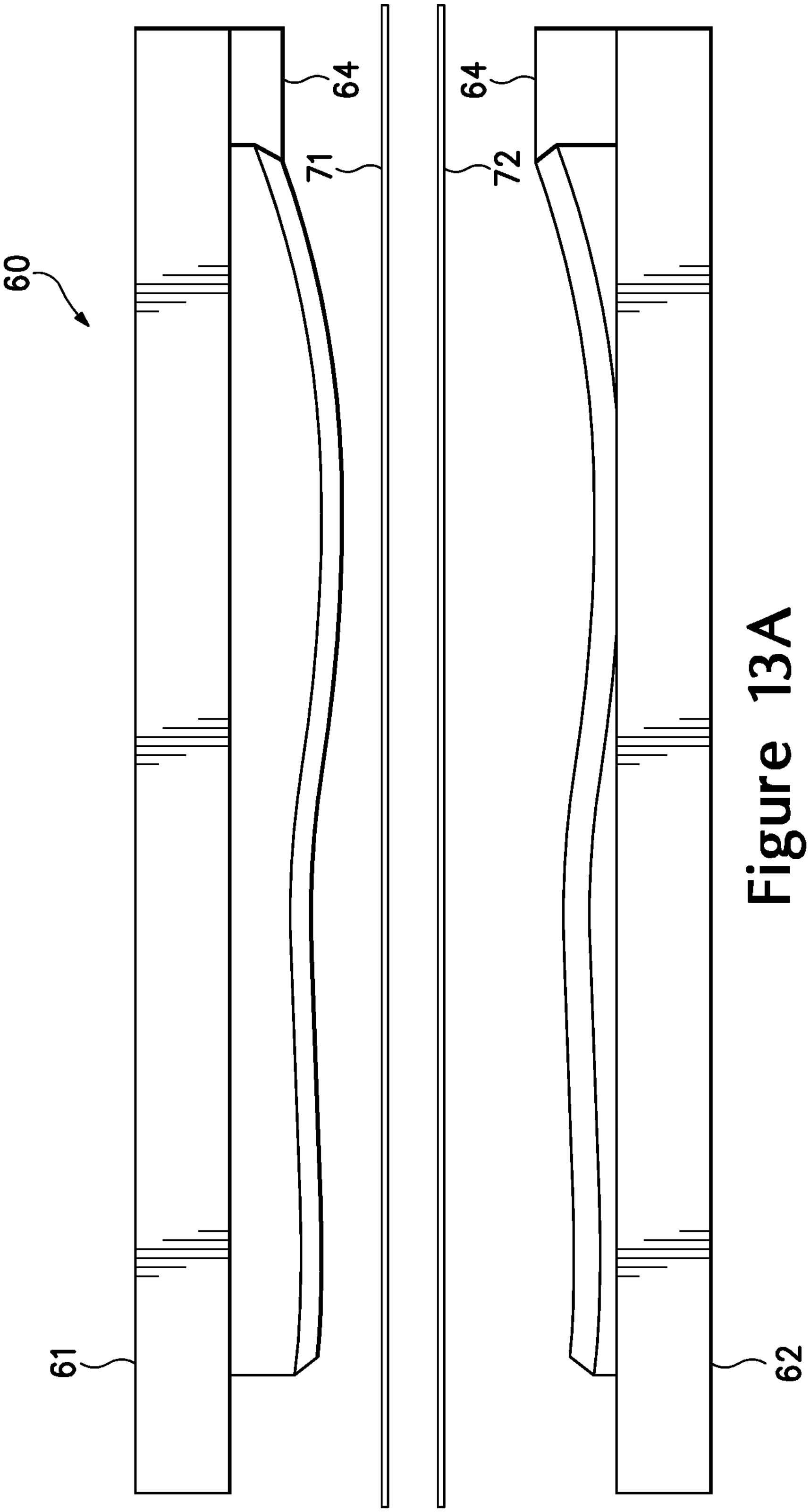
FIGS. 13A-13C are side elevational views of the mold depicting steps in a manufacturing process of the chamber.

The manner in which mold 60 is utilized to form chamber 40 from two polymer sheets 71 and 72 will now be discussed in greater detail. Initially, polymer sheets 71 and 72 are positioned between mold portions 61 and 62, as depicted in FIG. 13A. A plurality of conduits may extend through mold 60 in order to channel a heated liquid, such as water or oil, through mold 60, thereby raising the overall temperature of mold 60. When polymer sheets 71 and 72 are positioned within mold 60, as described in greater detail below, heat may be transferred from mold 60 to polymer sheets 71 and 72 in order to raise the temperature of polymer sheets 71 and 72. At elevated temperatures that depend upon the specific polymer material utilized, polymer sheets 71 and 72 soften or become more deformable, which facilitates shaping and bonding. In some manufacturing processes, various conductive or radiative heaters may be utilized to heat polymer sheets 71 and 72 prior to placement within mold 60 in order to decrease manufacturing times. The temperature of mold 60 may vary depending upon the specific materials utilized for polymer sheets 71 and 72.

Polymer sheets 71 and 72 respectively form upper surface 41 and lower surface 42 of chamber 40. In addition, polymer sheets 71 and 72 each form portions of sidewall surface 43. The thickness of polymer sheets 71 and 72 prior to molding may be greater than the thickness of surfaces 41-43 in chamber 40. The rationale for the difference in thickness between polymer sheets 71 and 72 and surfaces 41-43 is that polymer sheets 71 and 72 may stretch during the thermoforming process. That is, the thickness differences compensate for thinning in polymer sheets 71 and 72 that occurs when polymer sheets 71 and 72 are stretched or otherwise deformed during the formation of upper surface 41, lower surface 42, and sidewall surface 43.

Figure 13B:
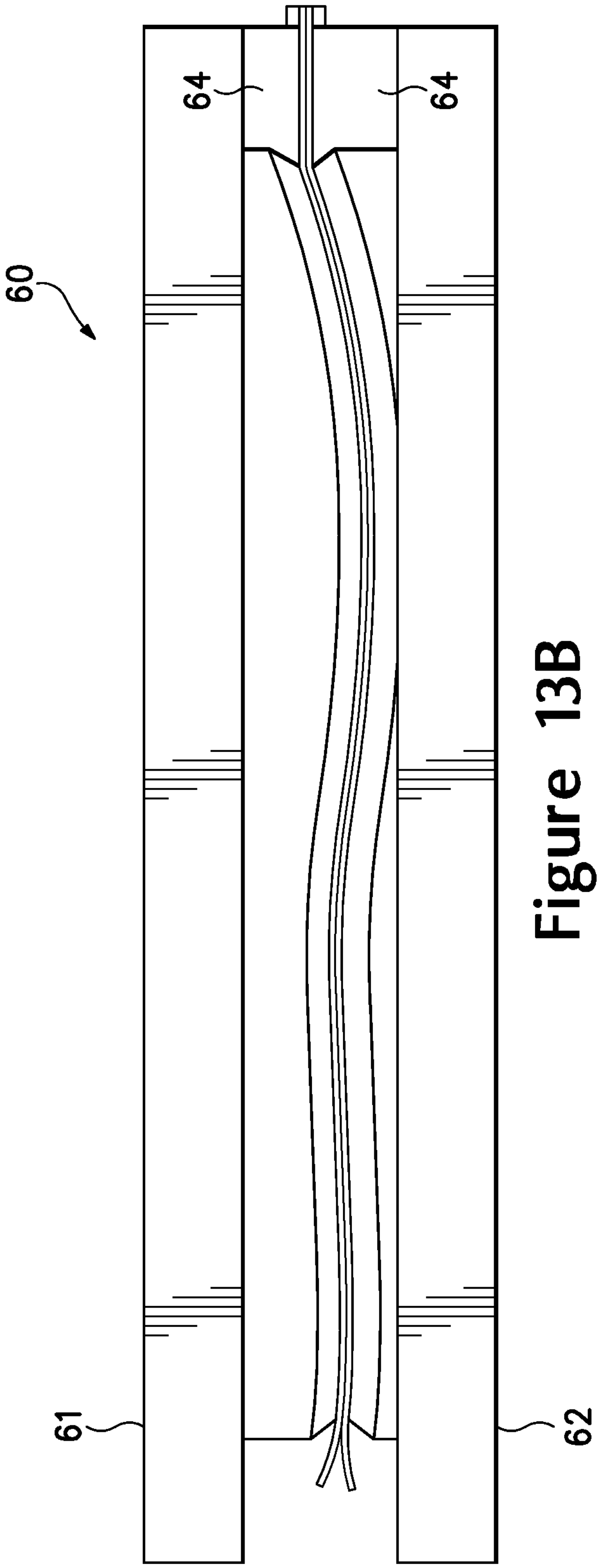

Once polymer sheets 71 and 72 are positioned between mold portions 61 and 62, mold portions 61 and 62 translate toward each other such that polymer sheets 71 and 72 enter cavities 63 and are shaped and bonded, as depicted in FIG. 13B. As mold 60 contacts and compresses portions of polymer sheets 71 and 72, a fluid, such as air, having a positive pressure in comparison with ambient air may be injected between polymer sheets 71 and 72 to induce polymer sheets 71 and 72 to respectively contact and conform to the contours of mold portions 61 and 62. Air may also be removed from the area between polymer sheets 71 and 72 and mold portions 61 and 62 through various vents, thereby drawing polymer sheets 71 and 72 onto the surfaces of mold portions 61 and 62. That is, at least a partial vacuum may be formed between polymer sheets 71 and 72 and the surfaces of mold portions 61 and 62. As the area between polymer sheets 71 and 72 is pressurized and air is removed from the area between mold 60 and polymer sheets 71 and 72, polymer sheets 71 and 72 conform to the shape of mold 60. More specifically, polymer sheets 71 and 72 stretch, bend, or otherwise conform to extend along the surfaces of cavities 63 within mold 60 and form the general shape of chamber 40. In addition to shaping polymer sheets 71 and 72, mold portions 61 and 62 compress polymer sheets 71 and 72 together at locations corresponding with peripheral bond 44 and interior bonds 45.

Figure 13C:
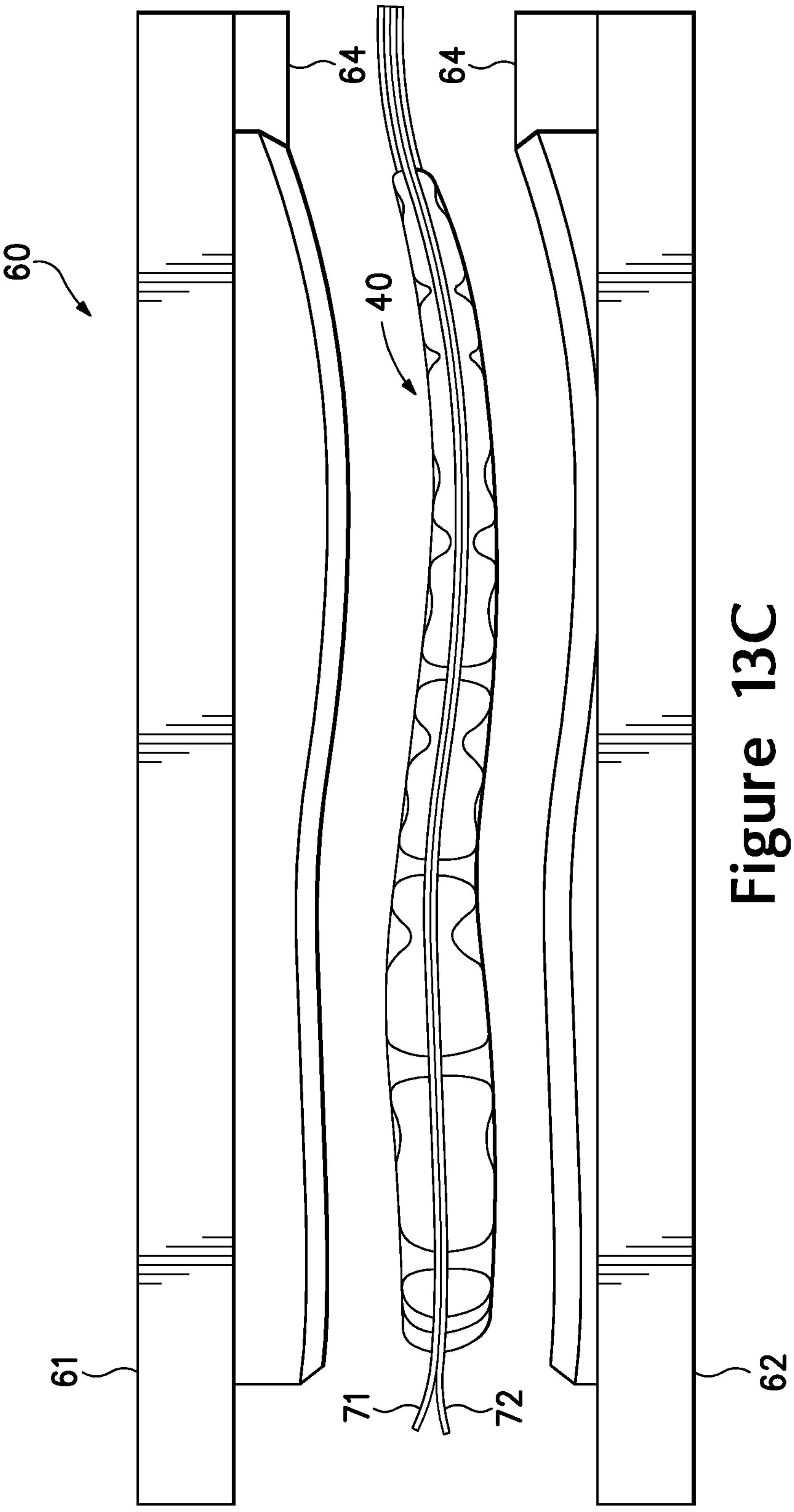
Figure 14:
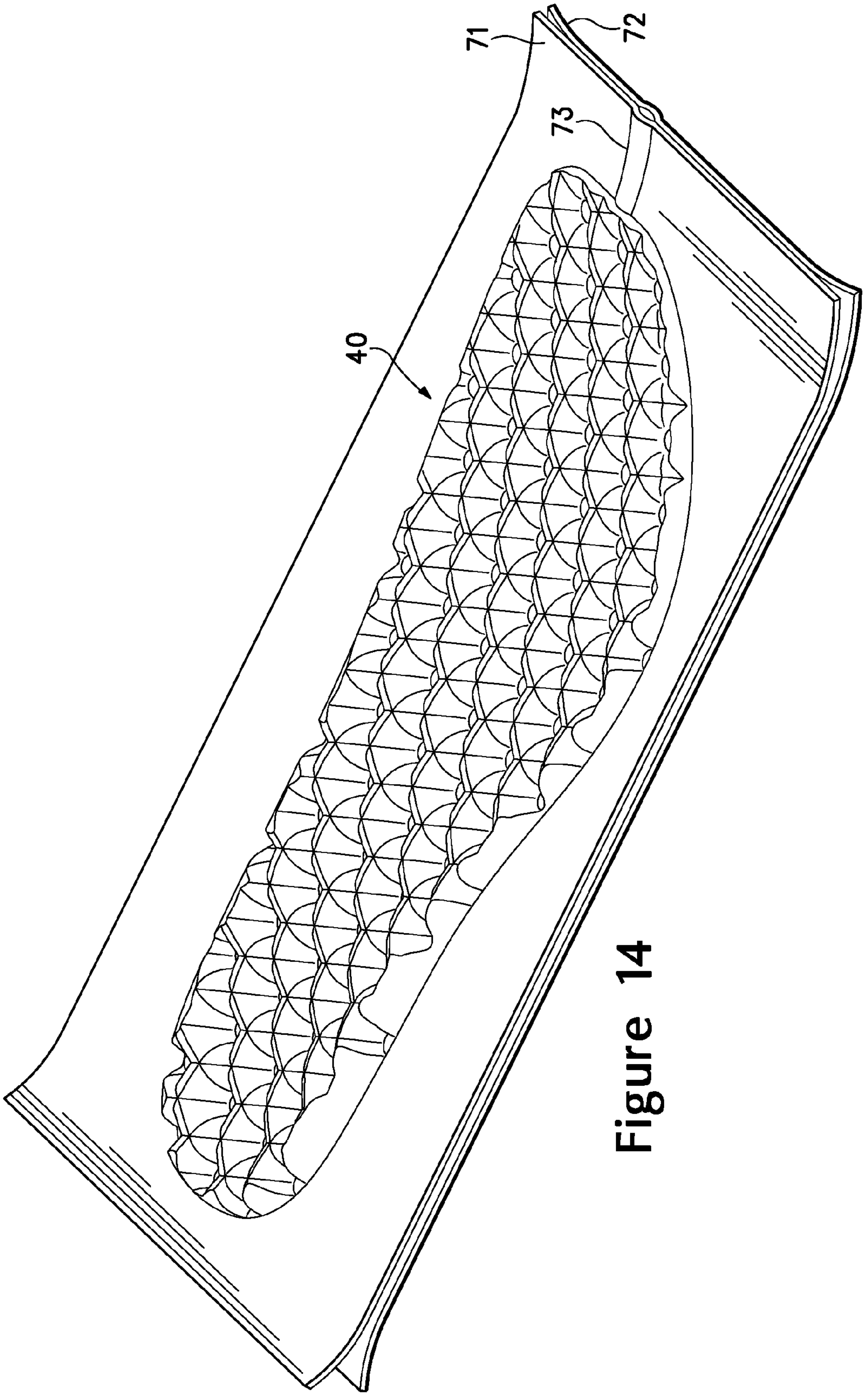
FIG. 14 is a perspective view of the chamber and residual portions of polymer sheets forming the chamber following the manufacturing process.

Once chamber 40 is formed within mold 60, mold portions 61 and 62 separate such that chamber 40 and peripheral portions of polymer sheets 71 and 72 may be removed from mold 60, as depicted in FIGS. 13C and 14. Chamber 40 is then permitted to cool, and a pressurized fluid may be injected in a conventional manner. Referring to FIG. 12, mold portions 61 and 62 are depicted as each including a channel 64 extending from areas forming cavity 63. During the thermoforming process discussed above, channels 64 form a conduit 73 that leads to chamber 40. Conduit 73 may be utilized to inject the pressurized fluid, and conduit 73 may then be sealed at a position that corresponds with peripheral bond 44 to seal chamber 40. In addition, excess portions of polymer layers 71 and 72 may be trimmed or otherwise removed from chamber 40. The excess portions may then be recycled or reutilized to form additional polymer layers 71 and 72 for other chambers 40.

Although the thermoforming process discussed above is a suitable manner of forming chamber 40, a blowmolding process may also be utilized. In general, a suitable blowmolding process involves positioning a parison between a pair of mold portions, such as mold portions 61 and 62. The parison is a generally hollow and tubular structure of molten polymer material. In forming the parison, the molten polymer material is extruded from a die. The wall thickness of the parison may be substantially constant, or may vary around the perimeter of the parison. Accordingly, a cross-sectional view of the parison may exhibit areas of differing wall thickness. Suitable materials for the parison include many of the materials discussed above with respect to chamber 40. Following placement of the parison between the mold portions, the mold portions close upon the parison and pressurized air within the parison induces the liquefied elastomeric material to contact the surfaces of the mold. In addition, closing of the mold portions and the introduction of pressurized air induces the liquefied elastomeric material to contact the surfaces of the mold portions. Air may also be evacuated from the area between the parison and the mold portions to further facilitate molding and bonding. Accordingly, chamber 40 may also be formed through a blowmolding process. As a further alternative, a conventional rotational molding process may be utilized for form chamber 40.

Further Configurations

Chamber 40, as discussed above and in the figures, has a configuration that is suitable for a variety of footwear types and athletic activities. In further configurations, chamber 40 may exhibit greater thickness adjacent medial side 15 than lateral side 14. The typical motion of the foot during running proceeds as follows: First, the heel strikes the ground, followed by the ball of the foot. As the heel leaves the ground, the foot rolls forward so that the toes make contact, and finally the entire foot leaves the ground to begin another cycle. During the time that the foot is in contact with the ground and rolling forward, it also rolls from the outside or lateral side to the inside or medial side, a process called pronation. By providing greater thickness to medial side 15, the rolling motion of the foot may be limited to control pronation.

Figure 15A:
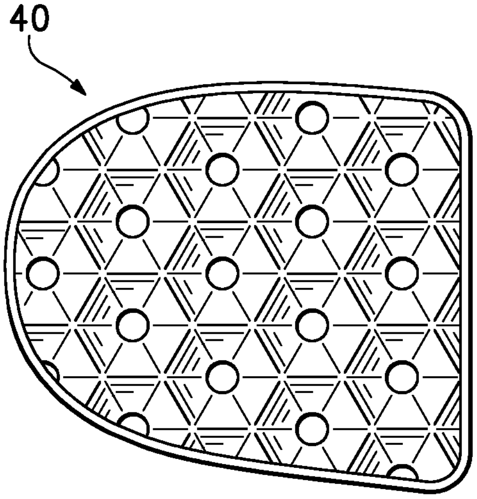
FIGS. 15A-15E are top plan views of alternate configurations of the chamber.
Figure 15B:
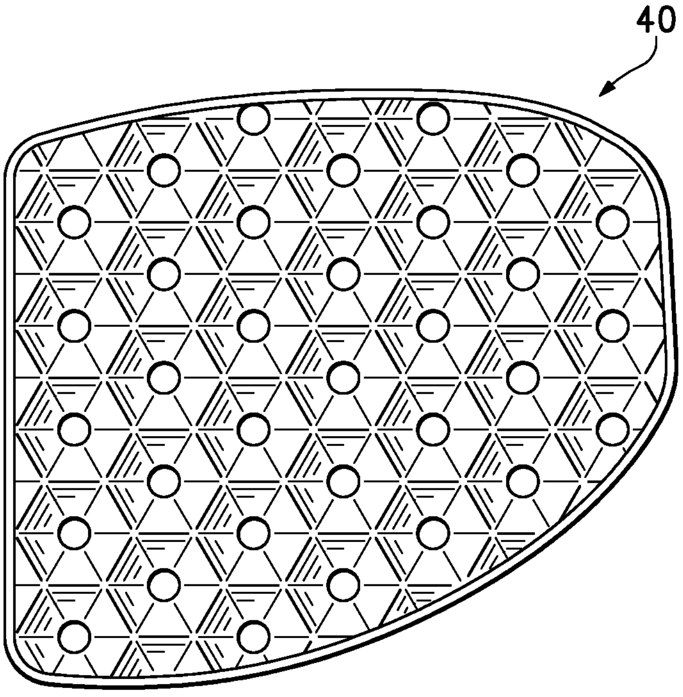

When incorporated into footwear 10, chamber 40 has a shape that fits within a perimeter of midsole 31 and extends from forefoot region 11 to heel region 13 and also from lateral side 14 to medial side 15, thereby corresponding with a general outline of the foot. Although this configuration of chamber 40 is suitable for many footwear types, chamber 40 may have a configuration that only extends under portions of the foot. With reference to FIG. 15A, a version of chamber 40 that is intended to be located primarily in heel region 13 is depicted. Similarly, a version of chamber 40 that is intended to be located primarily in forefoot region 11 is depicted in FIG. 15B.

Figure 15C:
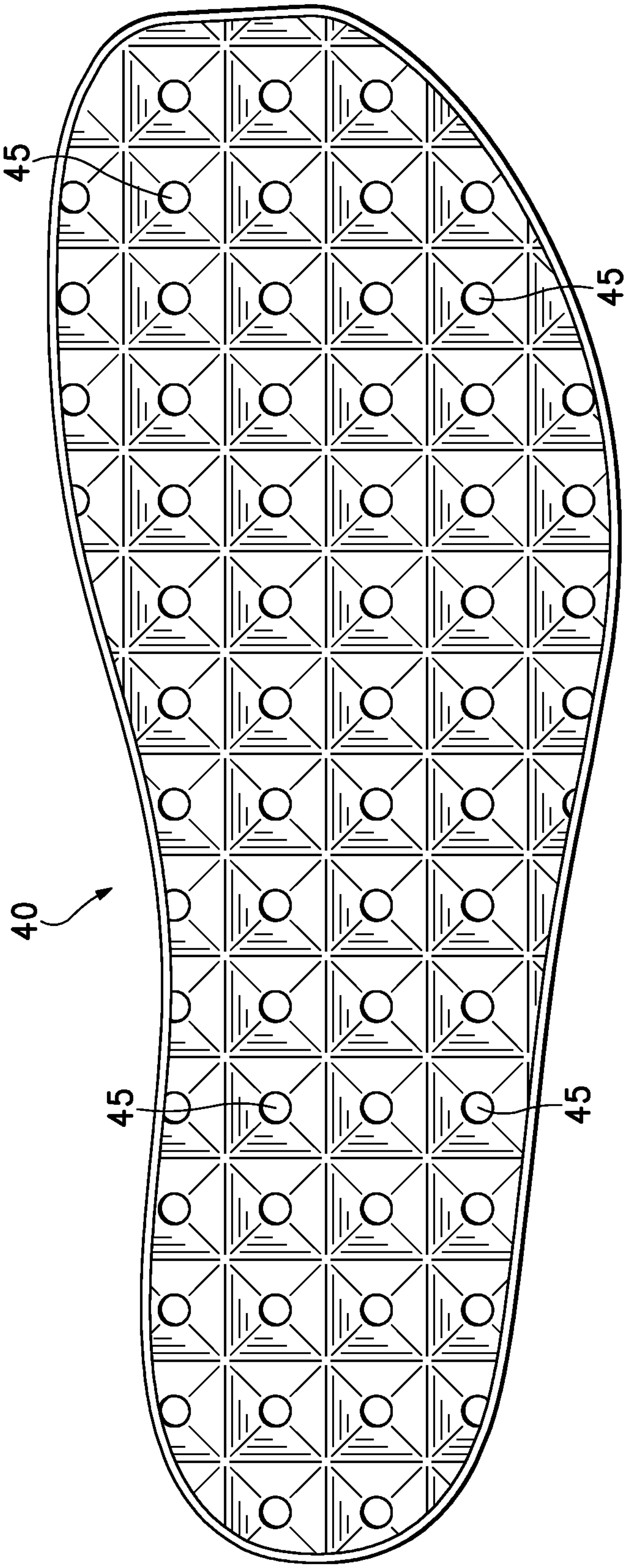
Figure 15D:
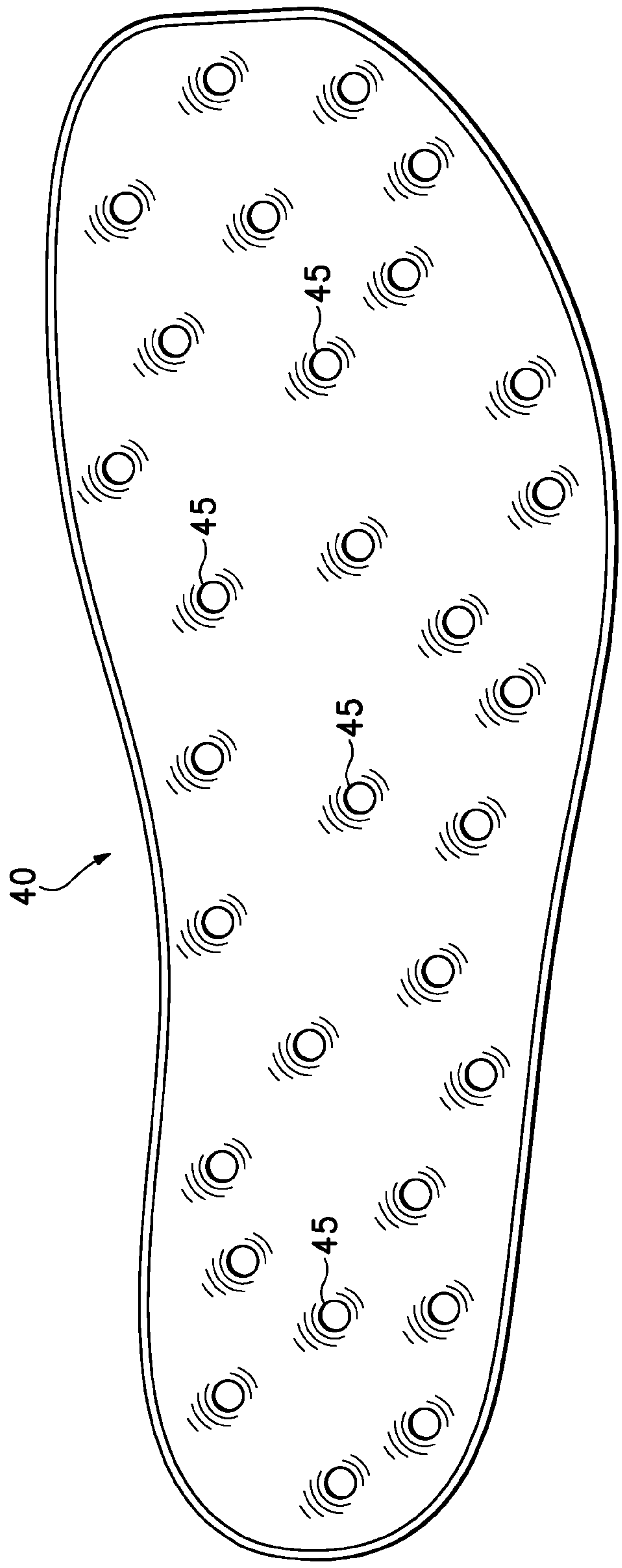

Interior bonds 45 are depicted as being arranged in a hexagonal array. As noted above, however, interior bonds 45 may also be arranged in a triangular array, a square array, a rectangular array, or in an irregular distribution. With reference to FIG. 15C, a version of chamber 40 wherein interior bonds 45 are arranged in a square array is depicted. Similarly, a version of chamber 40 wherein interior bonds 45 are randomly distributed is depicted in FIG. 15D.

Figure 15E:
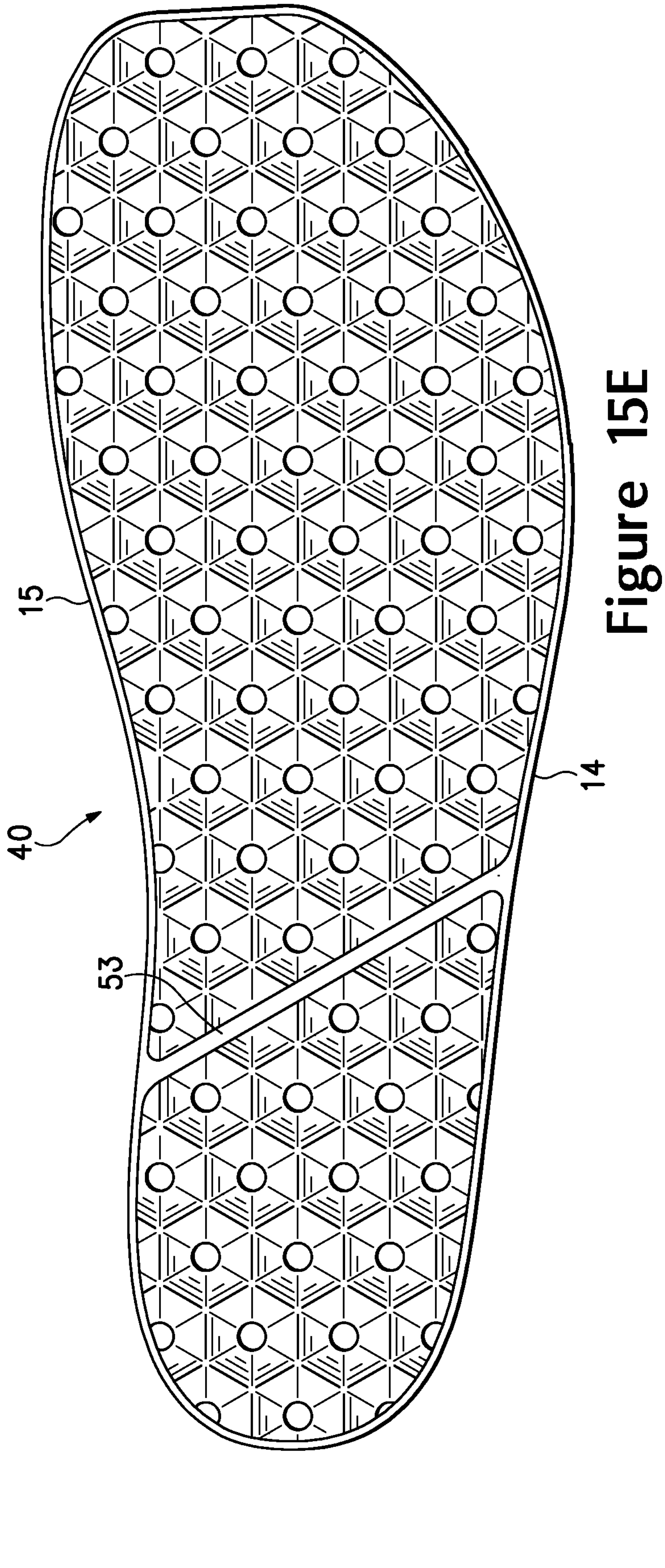

Chamber 40 has a configuration wherein the fluid within chamber 40 is free to flow between regions 11-13 and is at one pressure. In another configuration, as depicted in FIG. 15E, a bond 53 extends across chamber 40 and between sides 14 and 15. Bond 53 effectively segregates chamber 40 into two subchambers that may each enclose a fluid with different pressures. More particularly, bond 53 extends diagonally across heel region 13 to provide a different fluid pressure in the rear-lateral area of chamber 40. In some configurations, a bond similar to bond 53 may extend from forefoot region 11 to heel region 13 in order to provide different fluid pressures in areas of chamber 40 corresponding with sides 14 and 15.

The invention is disclosed above and in the accompanying drawings with reference to a variety of embodiments. The purpose served by the disclosure, however, is to provide an example of the various features and concepts related to the invention, not to limit the scope of the invention. One skilled in the relevant art will recognize that numerous variations and modifications may be made to the embodiments described above without departing from the scope of the present invention, as defined by the appended claims.

The invention claimed is:

1. A method of manufacturing a fluid-filled chamber of a sole structure for an article of footwear, the method comprising:

locating a first sheet and a second sheet of a polymer material between a pair of mold portions;

compressing the first sheet and the second sheet together between the pair of mold portions to form:

a peripheral bond that joins the first sheet and the second sheet around a periphery of the chamber; and a plurality of interior point bonds that join the first sheet and the second sheet and are spaced inward from the peripheral bond, the plurality of interior point bonds being located in a regularly-spaced hexagonal array;

shaping the first sheet and the second sheet to form elliptically-shaped structures between the plurality of interior point bonds;

sealing the chamber to enclose a fluid within the chamber and between the first sheet and the second sheet; and incorporating the fluid-filled chamber in the sole structure.

2. The method recited in claim 1, wherein shaping the first sheet and the second sheet includes forming a first region of the chamber to have a greater thickness than a second region of the chamber.

3. The method recited in claim 2, wherein shaping the first sheet and the second sheet further includes configuring the elliptically-shaped structures to have greater eccentricity in the first region than in the second region of the chamber.

4. The method recited in claim 1, wherein shaping the first sheet and the second sheet includes forming a majority of the elliptically-shaped structures to have a width that is less than a length, the width being defined as a dimension between the interior bonds, and the length being defined as a dimension that is perpendicular to the width.

5. The method recited in claim 1, wherein compressing the first sheet and the second sheet together includes forming a portion of the plurality of interior bonds with bond orientations that are angled with respect to each other.

6. The method recited in claim 1, wherein compressing the first sheet and the second sheet together includes forming a portion of the plurality of interior point bonds at a vertical location between a first surface of the chamber formed by the first sheet and an opposing second surface of the chamber formed by the second sheet.

7. The method recited in claim 6, wherein the vertical location is generally centered between the first surface and the second surface.

8. The method recited in claim 6, wherein compressing the first sheet and the second sheet together includes forming a portion of the plurality of interior point bonds with bond orientations that are angled with respect to at least one of a slope of the first surface and a slope of the second surface.

9. The method recited in claim 7, wherein compressing the first sheet and the second sheet together includes forming a portion of the plurality of point bonds with bond orientations that are an average of a slope of the first surface and a slope of the second surface.

10. A method of manufacturing a fluid-filled chamber of a sole structure for an article of footwear, the method comprising:

locating a first sheet and a second sheet of a polymer material between a pair of mold portions;

compressing the first sheet and the second sheet together between the pair of mold portions to form:

a peripheral bond that joins the first sheet and the second sheet around a periphery of the chamber, the chamber including a first surface formed by the first sheet and an opposing second surface formed by the second sheet; and a plurality of interior bonds that join the first sheet and the second sheet at respective locations that are spaced apart from one another and inward from the peripheral bond;

shaping the first sheet and the second sheet with the pair of mold portions to form a plurality of elliptically-shaped structures, at least a portion of the plurality of elliptically-shaped structures being located between the plurality of interior bonds, the plurality of elliptically-shaped structures having a greater eccentricity in a first region of the chamber than in a second region of the chamber;

sealing the chamber to enclose a fluid within the chamber and between the first sheet and the second sheet; and incorporating the fluid-filled chamber in the sole structure.

11. The method recited in claim 10, wherein shaping the first sheet and the second sheet includes forming the first region of the chamber to have a greater thickness than the second region of the chamber.

12. The method recited in claim 10, wherein shaping the first sheet and the second sheet includes forming a majority of the elliptically-shaped structures to have a width that is less than a length, the width being defined as a dimension extending between the interior bonds, and the length being defined as a dimension perpendicular to the width.

13. The method recited in claim 10, wherein compressing the first sheet and the second sheet together includes locating the plurality of interior bonds in a regularly-spaced array.

14. The method recited in claim 10, wherein compressing the first sheet and the second sheet together includes forming the plurality of interior bonds at a vertical location between a first surface of the chamber formed by the first sheet and an opposing second surface of the chamber formed by the second sheet, and forming a portion of the plurality of interior bonds with bond orientations that are angled with respect to each other.

15. The method recited in claim 10, wherein compressing the first sheet and the second sheet together includes forming a portion of the plurality of interior bonds at a vertical location between a first surface of the chamber formed by the first sheet and an opposing second surface of the chamber formed by the second sheet.

16. The method recited in claim 15, wherein the vertical location is generally centered between the first surface and the second surface.

17. The method recited in claim 15, wherein compressing the first sheet and the second sheet together includes forming a portion of the plurality of interior point bonds with bond orientations that are angled with respect to at least one of a slope of the first surface and a slope of the second sheet.

18. The method recited in claim 16, wherein compressing the first sheet and the second sheet together includes forming a portion of the plurality of point bonds with bond orientations that are an average of a slope of the first surface and a slope of the second surface.

* * * * *